(12) United States Patent
Funato et al.

(10) Patent No.: US 9,166,541 B2
(45) Date of Patent: Oct. 20, 2015

(54) SIGNAL PROCESSING CIRCUIT, RESOLVER DIGITAL CONVERTER, AND MULTIPATH NESTED MIRROR AMPLIFIER

(71) Applicant: RENESAS ELECTRONICS CORPORATION, Kawasaki-shi, Kanagawa (JP)

(72) Inventors: Yoshihiro Funato, Kanagawa (JP); Toshio Kumamoto, Kanagawa (JP); Tomoaki Yoshizawa, Kanagawa (JP); Kazuaki Kurooka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/254,294

(22) Filed: Apr. 16, 2014

(65) Prior Publication Data
US 2014/0340145 A1   Nov. 20, 2014

(30) Foreign Application Priority Data

May 15, 2013 (JP) .................................. 2013-103150

(51) Int. Cl.
| | |
|---|---|
| *H03F 1/02* | (2006.01) |
| *H03F 3/217* | (2006.01) |
| *H03F 3/393* | (2006.01) |
| *H03F 3/45* | (2006.01) |

(52) U.S. Cl.
CPC .............. *H03F 3/2171* (2013.01); *H03F 3/393* (2013.01); *H03F 3/45179* (2013.01); *H03F 2200/271* (2013.01); *H03F 2203/45116* (2013.01)

(58) Field of Classification Search
CPC ......................................................... H03F 1/02
USPC ......................................... 330/9, 69; 327/124
See application file for complete search history.

(56) References Cited

U.S. PATENT DOCUMENTS

| | | | |
|---|---|---|---|
| 6,911,864 B2* | 6/2005 | Bakker et al. .................... 330/9 |
| 7,292,095 B2 | 11/2007 | Burt et al. | |
| 7,511,549 B1* | 3/2009 | Luo ................................ 327/307 |
| 2006/0055456 A1* | 3/2006 | Niederkorn ...................... 330/9 |
| 2014/0210547 A1* | 7/2014 | Tomioka .......................... 330/9 |

FOREIGN PATENT DOCUMENTS

| | | |
|---|---|---|
| JP | 2008-219404 A | 9/2008 |
| JP | 2011-135225 A | 7/2011 |

OTHER PUBLICATIONS

Extended European Search report issued in Application No. 14164157.1 mailed Aug. 18, 2015.

(Continued)

*Primary Examiner* — Henry Choe
(74) *Attorney, Agent, or Firm* — Sughrue Mion, PLLC

(57) ABSTRACT

A signal processing circuit includes a chopper amplifier that has a differential amplifier circuit that amplifies differential input signals Vsp(t) and Vsm(t), and an adder circuit that generates an addition signal Vfil(t) by addition of the chopper output signal Vsub(t) that the chopper amplifier generates. Differential signals inputted into the differential amplifier circuit are interchanged for every first phase period and second phase period, and the adder circuit generates the addition signal by addition of the chopper output signal in the first phase period and in the second phase period.

18 Claims, 21 Drawing Sheets

(56) References Cited

OTHER PUBLICATIONS

Alberto Bilotti et al., "Chopper-Stabilized Amplifiers with a Track-and-Hold Signal Demodulator". IEEE Transactions on Circuits and Systems-1: Fundamental Theory and Applications, vol. 46, No. 4, Apr. 1999, p. 490-494.

"Linear Circuit Design Handbook: Chapter 9: Power Management". 2008.

* cited by examiner

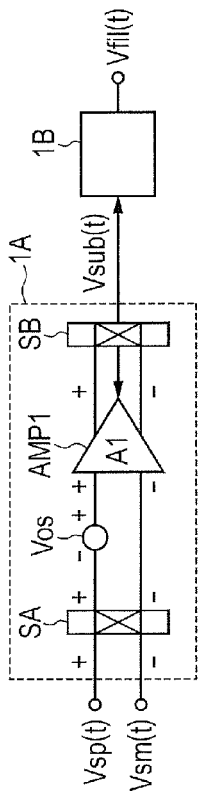
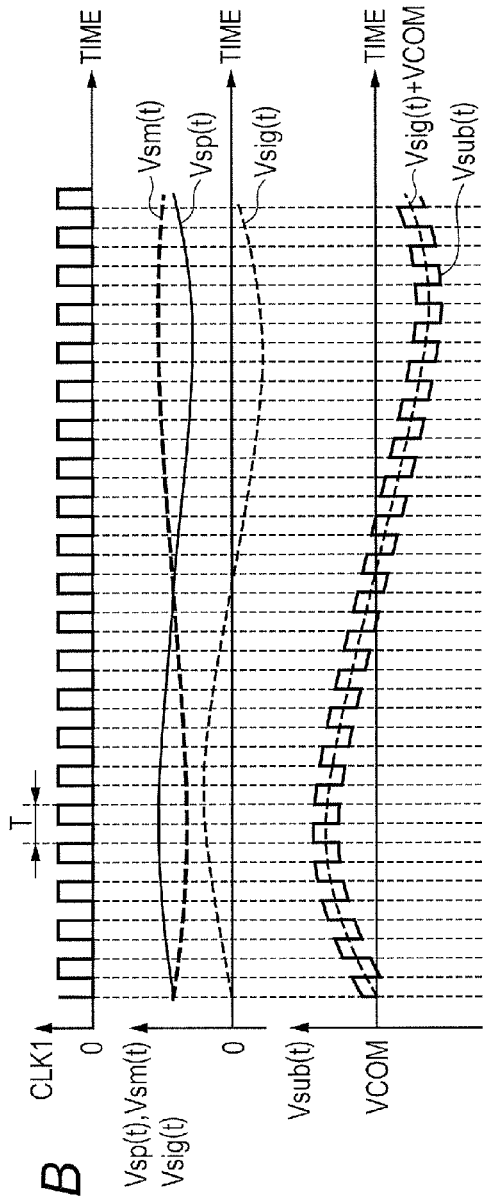
FIG. 2A
FIG. 2B
FIG. 2C

SIGNAL PROCESSING CIRCUIT, RESOLVER DIGITAL CONVERTER, AND MULTIPATH NESTED MIRROR AMPLIFIER

CROSS-REFERENCE TO RELATED APPLICATIONS

The disclosure of Japanese Patent Application No. 2013-103150 filed on May 15, 2013 including the specification, drawings and abstract is incorporated herein by reference in its entirety.

BACKGROUND

The present invention relates to a signal processing circuit and a semiconductor device including the signal processing circuit, for example, a semiconductor device including a chopper amplifier.

It is difficult for an amplifier or a comparator to secure accuracies of amplification of an input signal and comparison because of an offset voltage arising from a mismatch of its input part device.

Japanese Unexamined Patent Application Publication No. 2008-219404 discloses an amplifier circuit including a chopper amplifier and an averaging circuit. The averaging circuit samples an output voltage of the chopper amplifier at multiple sampling times, and generates an average voltage of the output voltages at the sampling times.

Japanese Unexamined Patent Application Publication No. 2011-135225 discloses an adder circuit that adds an output voltage of a chopper amplifier and a hold voltage of a first sample and hold circuit between a first timing at which positive/negative of the offset voltage that is superimposed on the output voltage of the chopper amplifier and a second timing at which the first sample and hold circuit performs sampling and holding.

U.S. Pat. No. 7,292,095 discloses an amplifier circuit including a chopper amplifier and a switched capacitor. The amplifier circuit removes an offset voltage whose positive/negative polarities invert at a predetermined period by chopping using a switched capacitor technology.

SUMMARY

Japanese Unexamined Patent Application Publication No. 2008-219404 does not disclose a configuration that removes an influence of an offset voltage whose positive/negative polarities are inverted by chopping. Japanese Unexamined Patent Application Publication No. 2011-135225 discloses a processing circuit that aims at removing an influence of the offset voltage whose positive/negative polarities are inverted by the chopping. However, since the processing circuit is comprised of a sample hold circuit having an operational amplifier and an adder, an offset arising from the operational amplifier is further superimposed on its output signal. Moreover, the configuration of the processing circuit becomes complicated and the number of parts increases. Other problems and new features will become clear from a description and accompanying drawings of this specification.

According to an aspect of the present invention, a signal processing circuit includes a chopper amplifier that generates a chopper output signal by amplifying differential input signals and an adder circuit that generates an addition signal by addition of the chopper output signal. The chopper amplifier has a differential amplifier circuit that amplifies differential input signals, the differential input signals inputted into the differential amplifier circuit being interchanged for every first phase period and second phase period of a control circuit, and the chopper amplifier generates a chopper output signal on which a non-inversion offset voltage and an inversion offset voltage are superimposed in the first phase period and in the second phase period, respectively, based on an output of the differential amplifier circuit. The adder circuit generates an addition signal by addition of the chopper output signal in the first phase period and in the second phase period.

According to the aspect of the present invention, the signal processing circuit where the influence of the offset voltage of its differential amplifier circuit is removed is realized.

BRIEF DESCRIPTION OF THE DRAWINGS

FIG. 2A is an equivalent circuit schematic and FIG. 2B and FIG. 2C are signal waveform charts of a principal part of the signal processing circuit according to the first embodiment, in which FIG. 2B shows waveforms of a chopping clock, a differential input signal Vsp(t), a differential input signal Vsm(t), a signal Vsig(t), and a chopper output signal, and FIG. 2C shows an enlarged waveform of the chopper output signal;

DETAILED DESCRIPTION

Hereinafter, embodiments will be described referring to drawings. In explanations of the embodiments, when mentioning the number, quantity, etc., it is not necessarily limited to that number, that quantity, etc. unless specially otherwise noted. In drawings of the embodiments, the same reference symbol and reference number shall express the same portion or an equivalent portion. Moreover, in explanations of the embodiments, there is a case where an overlapped explanation may not be repeated to a portion to which the same reference symbol, etc. is given and the like.

First Embodiment

Figure 1:
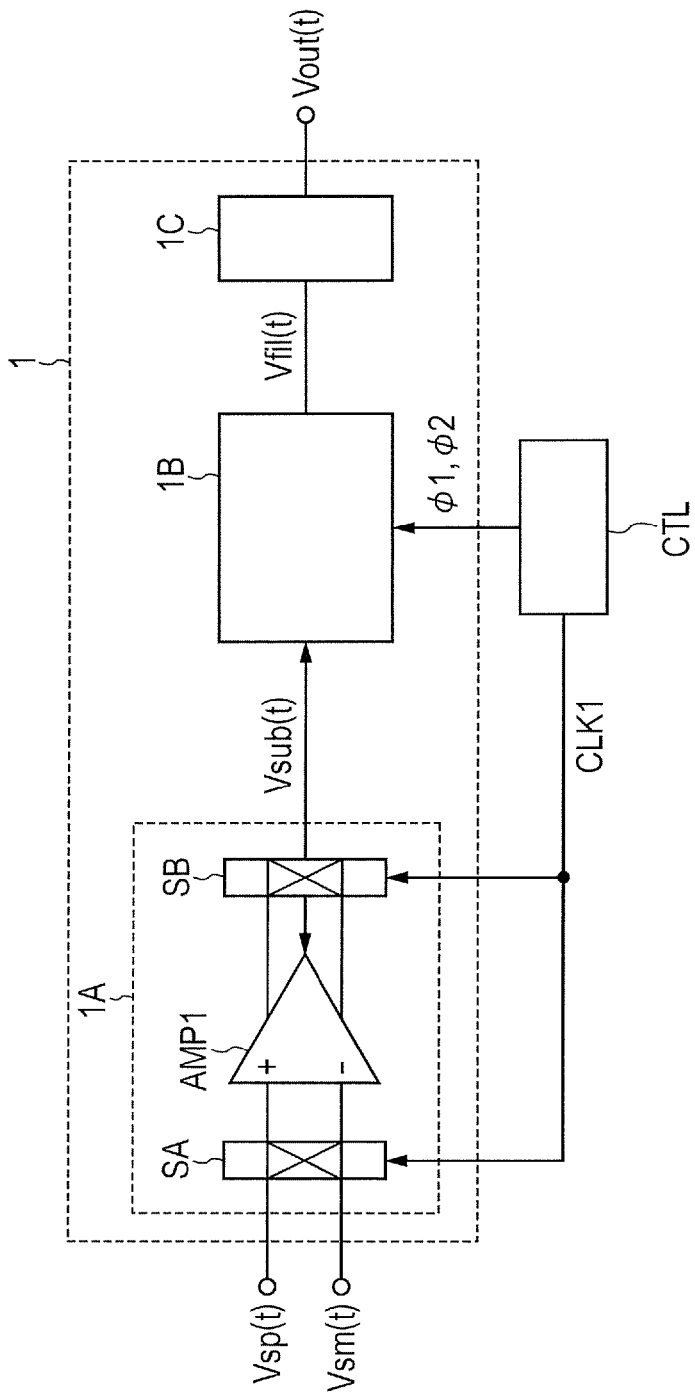
FIG. 1 is a block diagram of a signal processing circuit according to a first embodiment.

FIG. 1 shows a block diagram of a signal processing circuit 1 according to a first embodiment.

The signal processing circuit 1 has a chopper amplifier 1A, an adder circuit 1B, and an output-stage amplifier 1C. The chopper amplifier 1A has a modulation chopper circuit SA, a first-stage amplifier AMP1, and a demodulation chopper circuit SB. In the modulation chopper circuit SA and the demodulation chopper circuit SB, their chopping operations are controlled by a chopping clock CLK1 that a control circuit CTL outputs. In the adder circuit 1B, its operation is controlled by a control clock Φ1 and a control clock Φ2 that the control circuit CTL outputs.

A differential input signal Vsp(t) and a differential input signal Vsm(t) are inputted into the modulation chopper circuit SA. When a logic level of the chopping clock CLK1 is inverted, the modulation chopper circuit SA outputs the differential input signal Vsp(t) and the differential input signal Vsm(t) that are applied to a non-inversion input and an inversion input being an input node pair of the first-stage amplifier AMP1 after interchanging them from its output node pair, respectively.

A first signal and a second signal of the first-stage amplifier AMP1 are inputted into an input node pair of the demodulation chopper circuit SB. When the logic level of the chopping clock CLK1 is inverted, the demodulation chopper circuit SB outputs either one of the first signal and the second signal outputted from an output node pair of the first-stage amplifier AMP1 from one node of its output node pair alternately as a chopper output signal Vsub(t).

The adder circuit 1B samples the chopper output signal Vsub(t) that the chopper amplifier 1A outputs based on the control clock Φ1 and the control clock Φ2 and outputs an addition signal Vfil(t) by addition of the sampled values.

The output-stage amplifier 1C outputs an output signal Vout(t) of the signal processing circuit 1 by amplifying the addition signal Vfil(t).

FIG. 2 shows an equivalent circuit schematic and a signal waveform of a principal part of the signal processing circuit 1 according to the first embodiment.

FIG. 2A shows a coupling relationship of the equivalent circuit of the chopper amplifier 1A included in the signal processing circuit 1 shown in FIG. 1 and the adder circuit 1B.

The differential input signal Vsp(t) and the differential input signal Vsm(t) that are applied to the chopper amplifier 1A are applied to the first-stage amplifier AMP1 through the modulation chopper circuit SA. An offset voltage Vos that the first-stage amplifier AMP1 has is inserted between an output of the modulation chopper circuit SA and the non-inversion input of the first-stage amplifier AMP1 equivalently as a voltage source Vo. An output of the first-stage amplifier AMP1 is outputted as the chopper output signal Vsub(t) through the demodulation chopper circuit SB.

FIG. 2B shows waveforms of the chopping clock CLK1, the differential input signal Vsp(t), the differential input signal Vsm(t), a signal Vsig(t), and the chopper output signal Vsub(t).

The chopping clock CLK1 is a clock pulse train having a period T. The differential input signal Vsp(t) and the differential input signal Vsm(t) that are applied to the signal processing circuit 1 are differential input signals each of whose amplitudes is slowly changed with respect to a period T of the chopping clock CLK1. In other words, switching speeds of the modulation chopper circuit SA and the demodulation chopper circuit SB are set to a speed sufficiently high to time variations of the differential input signal Vsp(t) and the differential input signal Vsm(t).

The signal Vsig(t) has a multiplication value of a value obtained by subtracting the differential input signal Vsm(t) from the differential input signal Vsp(t) and a voltage amplification rate A1 of the first-stage amplifier AMP1. That is, $$Vsig(t)=A1*(Vsp(t)-Vsm(t)) \quad \text{Formula 1}$$

holds.

As will be described, the chopper output signal Vsub(t) is an additional value of the signal Vsig(t), the chopping clock CLK1 on which an inversion offset voltage Vos and a non-inversion offset voltage Vos are superimposed for every half period thereof alternately, and a reference signal VCOM. Here, in the chopping clock CLK1, a half period in which its logic level is in one side is designated as a first phase period, and a half period in which the logic level is in the other side is designated as a second phase period. As one example, periods in which the chopping clock CLK1 is at the low level and at the high level are designated as the first phase period and the second phase period, respectively.

FIG. 2C schematically shows a waveform of the chopper output signal Vsub(t). FIG. 2C is a waveform chart in which each waveform of the chopping clock CLK1 corresponding to three periods shown in FIG. 2B is enlarged in a time axis.

The chopper amplifier 1A outputs the chopper output signal Vsub(t) on which the non-inversion offset voltage Vos is superimposed and the chopper output signal Vsub(t) on which the inversion offset voltage Vos is superimposed in the first phase period and in the second phase period, respectively.

Here, "the chopper output signal Vsub(t) on which non-inversion/inversion offset voltages Vos are superimposed" means the following. Temporarily, when the offset voltage Vos of the first-stage amplifier AMP1 is zero, the chopper amplifier 1A generates the chopper output signal Vsub(t) that has a value of Formula 2.

$$A1*(Vsp(t)-Vsm(t))+VCOM \quad \text{Formula 2}$$

Where, the sign "A1" is the voltage amplification rate of the first-stage amplifier AMP1, and a sign "*" is a multiplication sign.

However, when the first-stage amplifier AMP1 has an offset voltage Vos that is not zero, the chopper output signal Vsub(t) is set to values obtained by Formula 21 and Formula 22 in the first phase period and in the second phase period, respectively.

$$A1*(Vsp(t)-Vsm(t))+abs(Vos)+VCOM \quad \text{Formula 21}$$

$$A1*(Vsp(t)-Vsm(t))-abs(Vos)+VCOM \quad \text{Formula 22}$$

Where, a sign abs (Vos) is an absolute value of the offset voltage Vos.

Formula 21 is a calculation formula of the chopper output signal Vsub(t) on which that the non-inversion offset voltage Vos is superimposed, and Formula 22 is a calculation formula of the chopper output signal Vsub(t) on which the inversion offset voltage Vos is superimposed.

In FIG. 2C, an overshoot wave and an undershoot wave that occur immediately after a change of the chopper output signal Vsub(t) are noises occurring with switching of the modulation chopper circuit SA and the demodulation chopper circuit SB.

Figure 3:
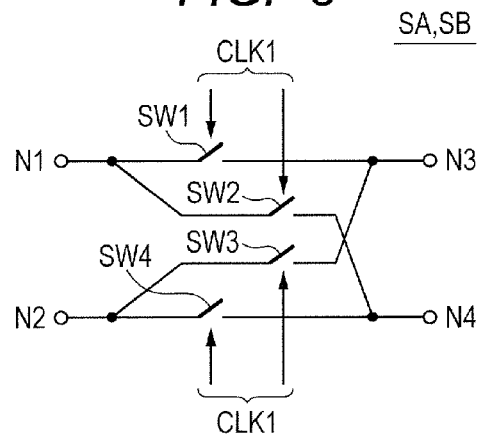
FIG. 3 is circuit diagram of a modulation chopper circuit and a demodulation chopper circuit included in the signal processing circuit according to the first embodiment.

FIG. 3 is a circuit diagram of the modulation chopper circuit SA and the demodulation chopper circuit SB included in the signal processing circuit 1 according to the first embodiment.

The modulation chopper circuit SA and the demodulation chopper circuit SB are cross switches that have an identical configuration.

In the modulation chopper circuit SA and the demodulation chopper circuit SB, a switch SW1 is coupled between a node N1 and a node N3, and a switch SW4 is coupled between a node N2 and a node N4. A switch SW2 is coupled between the node N1 and the node N4, and a switch SW3 is coupled between the node N2 and the node N3. Conduction states of the switch SW1 and the switch SW4 and conduction states of the switch SW2 and the switch SW3 are controlled so as to be contrary to each other by the chopping clock CLK1.

Over a period in which the chopping clock CLK1 is at the low level (the first phase period), the switch SW1 and the switch SW4 are set to be in the conduction state and the switch SW2 and the switch SW3 are set to be in the non-conduction state. Over a period in which the chopping clock CLK1 is at the high level (the second phase period), the switch SW1 and the switch SW4 are set to be in the non-conduction state and the switch SW2 and the switch SW3 are set to be in the conduction state.

The differential input signal Vsp(t) and the differential input signal Vsm(t) are applied to the node N1 and the node N2 of the modulation chopper circuit SA, respectively. The node N3 and the node N4 are coupled with the non-inversion input and the inversion input of the first-stage amplifier AMP1, respectively.

The first signal and the second signal of the first-stage amplifier AMP1 are applied to the node N1 and the node N2 of the demodulation chopper circuit SB, respectively. Either one of the first signal and the second signal is selected from the node N3 and is outputted as the chopper output signal Vsub(t) of the first-stage amplifier AMP1. Either one of the first signal and the second signal is selected from the node N4 and is fed back to the first-stage amplifier AMP1.

Figure 4:
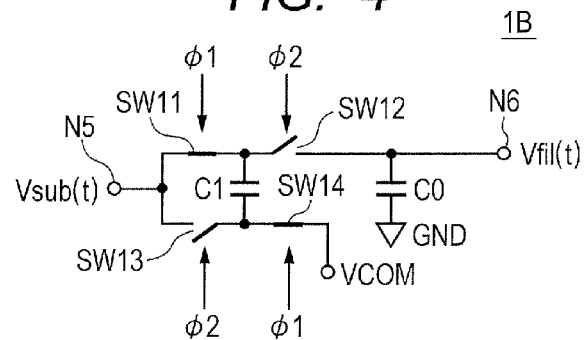
FIG. 4 is a circuit diagram of an adder circuit included in the signal processing circuit according to the first embodiment.

FIG. 4 is a circuit diagram of the adder circuit 1B included in the signal processing circuit 1 according to the first embodiment. The adder circuit 1B is an adder that uses a switched capacitor technology.

The adder circuit 1B has a switch SW11, a switch SW12, a switch SW13, a switch SW14, a capacitive element C0, and an arithmetic capacitive element C1. The switch SW11 and the switch SW13 are coupled between a node N5 and one end and the other end of the arithmetic capacitive element C1, respectively. The switch SW12 is coupled between a node N6 and one end of the arithmetic capacitive element C1. One end of the switch SW14 is coupled to the other end of the arithmetic capacitive element C1, and the reference signal VCOM is applied to the other end of the switch SW14. One end of the capacitive element C0 is coupled with the node N6, and a ground voltage GND is applied to the other end thereof. The capacitive element C0 holds a voltage applied to the node N6.

The chopper output signal Vsub(t) is inputted into the node N5, and the addition signal Vfil(t) is outputted from the node N6. Conduction states of the switch SW11 and the switch SW14 are controlled by the control clock Φ1, and conduction states of the switch SW12 and the switch SW13 are controlled by the control clock Φ2. Furthermore, the conductions states of the switches SW11 and SW14 and the conductions states of the switches SW12 and SW13 are controlled so as to be contrary to each other.

For example, over a period in which the control clock Φ1 is at the high level (a period in which the control clock Φ2 is at the low level), the switch SW11 and the switch SW14 are set to be in the conduction state, and the switch SW12 and the switch SW13 are set to be in the non-conduction state. On the other hand, over a period in which the control clock Φ2 is at the high level (a period in which the control clock Φ1 is at the low level), the switch SW12 and the switch SW13 are set to be in the conduction state, and the switch SW12 and the switch SW13 are set to be in the non-conduction state.

Figure 5:
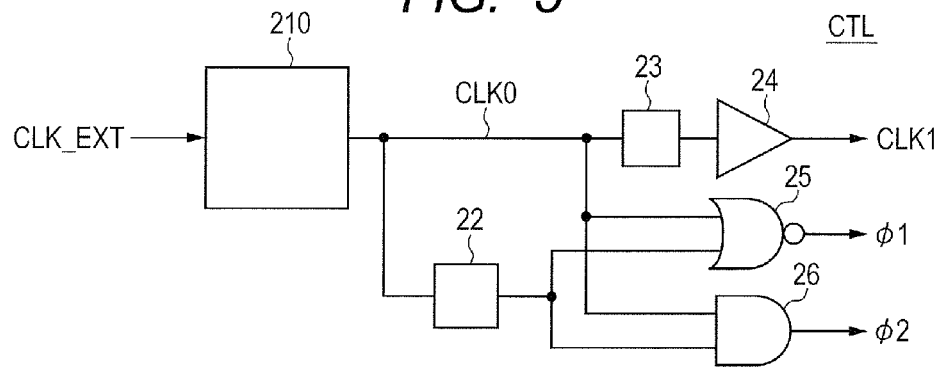
FIG. 5 is a block diagram of a control circuit for supplying various clocks to the signal processing circuit according to the first embodiment.

FIG. 5 shows a block diagram of the control circuit CTL for supplying various clocks to the signal processing circuit 1 according to the first embodiment.

The control circuit CTL has a chopping clock generation circuit 210, a delay circuit 22, a delay circuit 23, a buffer 24, a NOR gate 25, and an AND gate 26. The chopping clock generation circuit 210 generates a clock CLK0 based on a clock CLK_EXT.

The control circuit CTL is formed in a logic circuit region of the semiconductor device that mounts the signal processing circuit 1, as one example. A configuration of the control circuit CTL is not limited to a logic circuit, but a part or the whole of functions may be realized in an analog circuit, and may be placed around the signal processing circuit 1. Moreover, the control circuit CTL may be realized in a semiconductor device etc. different from the semiconductor device that mounts the signal processing circuit 1.

The NOR gate 25 outputs a NOR processing result of the clock CLK0 whose timing is adjusted by the delay circuit 22 and the clock CLK0 that the chopping clock generation circuit 210 outputs as the control clock Φ1. After the delay time by the delay circuit 22 elapses from a time when the clock CLK0 changes to the low level from the high level, the control clock Φ1 changes to the high level from the low level. Then, when the clock CLK0 changes to the high level from the low level, the control clock Φ1 changes to the low level from the high level. That is, the control clock Φ1 is a clock pulse generated immediately before the clock CLK0 rises to the high level from the low level.

The AND gate 26 outputs an AND processing result of the clock CLK0 whose timing is adjusted by the delay circuit 22 and the clock CLK0 that the chopping clock generation circuit 210 outputs as the control clock Φ2. After the delay time by the delay circuit 22 elapses from the time when the clock CLK0 changed to the high level from the low level, the control clock Φ2 changes to the high level from the low level. Then, when the clock CLK0 changes to the low level from the high level, the control clock Φ2 changes to the low level from the high level. That is, the control clock Φ2 is a clock pulse generated immediately before the clock CLK0 falls to the low level from the high level.

The control circuit CTL performs timing adjustment of the clock CLK0 by the delay circuit 23, and outputs it as the chopping clock CLK1 from the buffer 24. Therefore, a relationship among the chopping clock CLK1, the control clock Φ1, and the control clock Φ2 becomes as follows.

The control clock Φ1 is generated at a time earlier than a time when the chopping clock CLK1 rises to the high level from the low level by a predetermined time. Similarly, the control clock Φ2 is generated at a time earlier than a time when the chopping clock CLK1 falls to the low level from the high level by a predetermined time. Each of both predetermined times is decided based on a delay time of the delay circuit 23.

Figure 6:
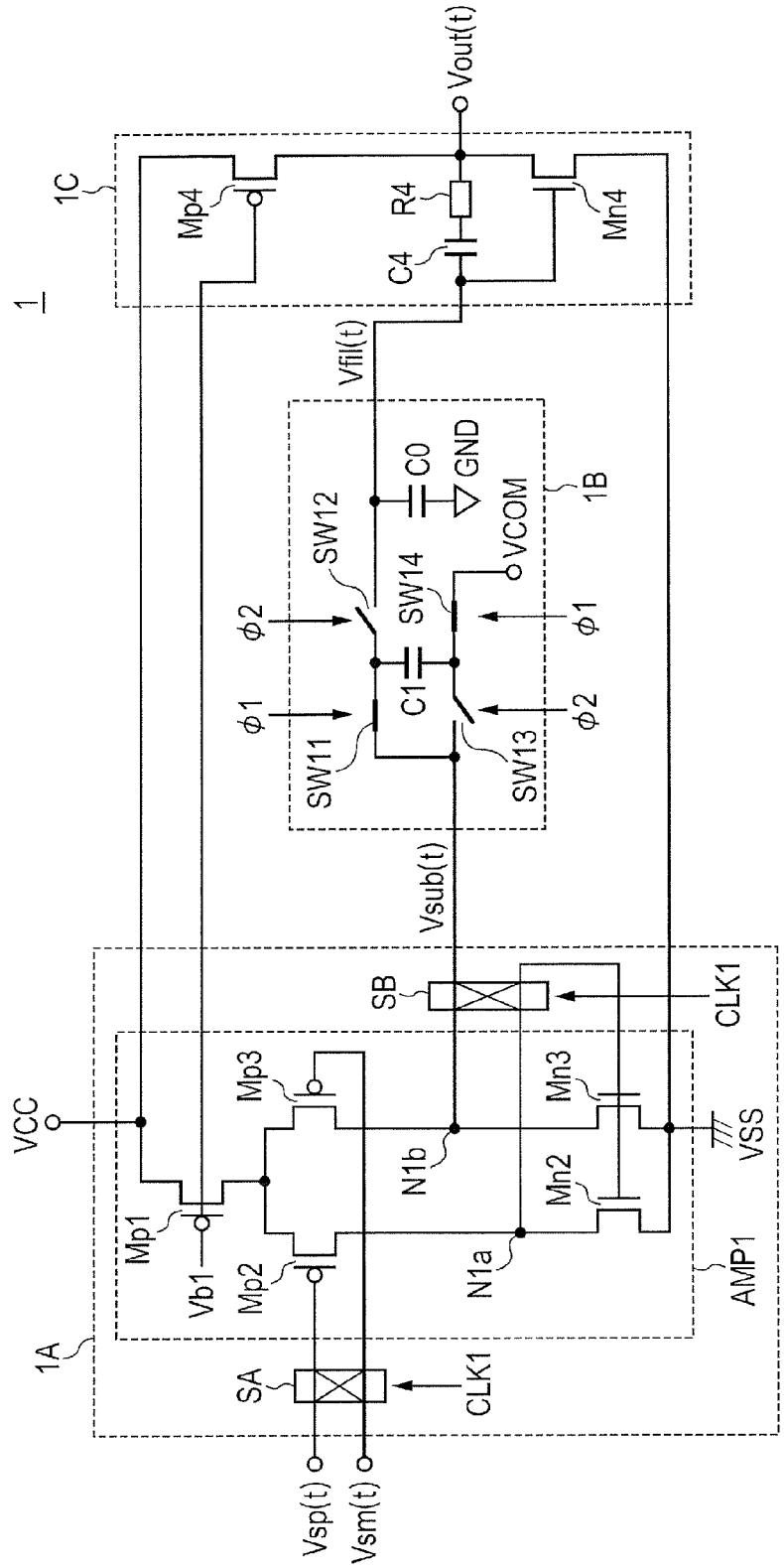
FIG. 6 is a circuit diagram of the signal processing circuit according to the first embodiment.

FIG. 6 shows a circuit diagram of the signal processing circuit 1 according to the first embodiment.

Configuration of Signal Processing Circuit 1

The signal processing circuit 1 has the chopper amplifier 1A, the adder circuit 1B, and the output-stage amplifier 1C.

The chopper amplifier 1A has the modulation chopper circuit SA, the first-stage amplifier AMP1, and the demodulation chopper circuit SB.

The first-stage amplifier AMP1 has a p-type transistor Mp1, a p-type transistor Mp2, a p-type transistor Mp3, an n-type transistor Mn2, an n-type transistor Mn3. A power source voltage VCC is applied to a source of the p-type transistor Mp1, and its drain is coupled with sources of the p-type transistor Mp2 and the p-type transistor Mp3. The bias voltage Vb1 is applied to a gate of the p-type transistor Mp1.

Drains of the p-type transistor Mp2 and the p-type transistor Mp3 are coupled with drains of the n-type transistor Mn2 and the n-type transistor Mn3, respectively, through a node N1a and a node N1b. A power source voltage VSS is applied to sources of the n-type transistor Mn2 and the n-type transistor Mn3. Gates of the n-type transistor Mn2 and the n-type transistor Mn3 are coupled with each other and they operate as a current mirror circuit.

The differential input signal Vsp(t) and the differential input signal Vsm(t) are applied to one input node and the other input node of the modulation chopper circuit SA, respectively. One output node and the other output node of the modulation chopper circuit SA are coupled with a gate of the p-type transistor Mp2 that is the non-inversion input of the first-stage amplifier AMP1 and a gate of the p-type transistor Mp3 that is the inversion input thereof, respectively.

One input node and the other input node of the demodulation chopper circuit SB are coupled with the node N1a and the node N1b, respectively. One output node of the demodulation chopper circuit SB is coupled with an input node of the adder circuit 1B. The other output node of the demodulation chopper circuit SB is coupled with the gates of the n-type transistor Mn2 and the n-type transistor Mn3 of the first-stage amplifier AMP1.

The demodulation chopper circuit SB couples the gates of the n-type transistor Mn2 and the n-type transistor Mn3 of which the current mirror circuit is comprised with either one of the node N1a and the node N1b. The chopper output signal Vsub(t) is outputted from either other of the node N1a or the node N1b. Therefore, the chopper amplifier 1A operates as a single ended amplifier.

The adder circuit 1B has a configuration shown in FIG. 4 as described above. The output-stage amplifier 1C outputs the output signal Vout(t) of the signal processing circuit 1 by amplifying the addition signal Vfil(t) that the adder circuit 1B outputs. The output-stage amplifier 1C has a p-type transistor Mp4, an n-type transistor Mn4, a capacitive element C4, and a resistor R4. The power source voltage VCC and the bias voltage Vb1 are applied to a source and a gate of the p-type transistor Mp4, respectively. A drain of the n-type transistor Mn4 is coupled with a drain of the p-type transistor Mp4, and outputs the output signal Vout(t) of the signal processing circuit 1.

The addition signal Vfil(t) that the adder circuit 1B outputs and the power source voltage VSS are applied to a gate and a source of the n-type transistor Mn4, respectively. Between the gate and the drain of the n-type transistor Mn4, the capacitive element C4 and the resistor R4 are coupled in series.

The output-stage amplifier 1C outputs the output signal Vout(t) of the signal processing circuit 1 by amplifying the addition signal Vfil(t). The output-stage amplifier 1C may be a comparator or another arithmetic circuit.

Operation of Signal Processing Circuit 1

The modulation chopper circuit SA applies the differential input signal Vsp(t) and the differential input signal Vsm(t) to the non-inversion input and the inversion input of the first-stage amplifier AMP1, respectively, over the first phase period of the chopping clock CLK1. The demodulation chopper circuit SB outputs a signal generated at the node N1b as the chopper output signal Vsub(t). The demodulation chopper circuit SB further applies a signal generated at the node N1a to the respective gates of the n-type transistor Mn2 and the n-type transistor Mn3 of the first-stage amplifier AMP1.

Therefore, the chopper amplifier 1A outputs the chopper output signal Vsub(t) on which the non-inversion offset voltage Va is superimposed over the first phase period of the chopping clock CLK1. The non-inversion offset voltage Va has a positive value.

The modulation chopper circuit SA applies the differential input signal Vsp(t) and the differential input signal Vsm(t) to the inversion input and the non-inversion input of the first-stage amplifier AMP1, respectively, over the second phase period of the chopping clock CLK1. The modulation chopper circuit SA interchanges the differential input signals applied to the non-inversion input and the inversion input of the first-stage amplifier AMP1 in response to inversion of the logic level of the chopping clock CLK1.

The demodulation chopper circuit SB outputs a signal generated at the node N1a as the chopper output signal Vsub(t) over the second phase period of the chopping clock CLK1. Furthermore, the demodulation chopper circuit SB applies a signal generated at the node N1b to the respective gates of the n-type transistor Mn2 and the n-type transistor Mn3 of the first-stage amplifier AMP1.

Therefore, the chopper amplifier 1A outputs the chopper output signal Vsub(t) on which the inversion offset voltage Vb is superimposed over the second phase period of the chopping clock CLK1. The inversion offset voltage Vb has a negative value.

The chopper amplifier 1A generates the chopper output signal Vsub(t) on which the non-inversion offset voltage Va and the inversion offset voltage Vb are superimposed, respectively, in the first phase period and in the second phase period of the chopping clock CLK1 having the period T.

The non-inversion offset voltage Va and the inversion offset voltage Vb originate mainly from mismatching of the input part device of the first-stage amplifier AMP1. Furthermore, in the case where an output stage of another chopper amplifier that has the same configuration is coupled to a prestage of this chopper amplifier 1A, the offset voltage of other chopper amplifier 1A has a voltage resulting from the offset voltage of the another chopper amplifier in the prestage.

The adder circuit 1B generates the addition signal Vfil(t) obtained by addition of the chopper output signal Vsub(t) on which the non-inversion offset voltage Va is superimposed on the basis of the reference signal VCOM and the chopper output signal Vsub(t) on which the inversion offset voltage Vb is superimposed similarly. Although the non-inversion offset voltage Va and the inversion offset voltage Vb have a positive value and a negative value, respectively, those absolute values are mutually equal. Therefore, the addition signal Vfil(t) has a value from which an influence of the offset voltage of the chopper amplifier 1A etc. was removed.

More detailed operations of the adder circuit 1B are as follows. In the first phase period, in response to the control clock $\Phi 1$, the switch SW11 and the switch SW14 change to the conduction state from the non-conduction state. At this time, each of the switch SW12 and the switch SW13 is in the non-conduction state. As a result, the chopper output signal Vsub(t) on which the non-inversion offset voltage Va is superimposed is applied to one end of the arithmetic capacitive element C1, and the reference signal VCOM is applied to the other end thereof. Electric charges depending on a potential difference between the reference signal VCOM and the chopper output signal Vsub(t) on which the non-inversion offset voltage Va is superimposed are accumulated in the arithmetic capacitive element C1.

When a period shifts to the second phase period from the first phase period, the switch SW12 and the switch SW13 change to the conduction state from the non-conduction state in response to the control clock $\Phi 2$. At this time, the switch SW11 and the switch SW14 change to the non-conduction state from the conduction state. The chopper output signal Vsub(t) on which the inversion offset voltage Vb is superimposed is applied to the other end of the arithmetic capacitive element C1.

The addition signal Vfil(t) obtained by addition of the chopper output signal Vsub(t) on which the non-inversion offset voltage Va and the inversion offset voltage Vb are superimposed, respectively, is outputted from one end of the arithmetic capacitive element C1, according to conservation of charge.

Capacity values of the capacitive element C0 and the arithmetic capacitive element C1 are set to values so that they may be sufficiently large to influences of charge injection of the switch SW11 to the switch SW14 and their charging and discharging may be completed within a sampling time. Furthermore, the capacity values of the capacitive element C0 and the arithmetic capacitive element C1 are selected considering a delay of the addition signal Vfil(t) with respect to the chopper output signal Vsub(t) that accompanies electric charge reallocation between the arithmetic capacitive element C1 and the capacitive element C0 that is performed when the switch SW12 is in the conduction state.

The reference signal VCOM is set to a predetermined constant voltage. By adjusting a set value of the reference signal VCOM, it becomes possible to set up a direct current level of the addition signal Vfil(t). Especially, by setting a direct current level of the chopper output signal Vsub(t) decided from a common voltage of the differential input signal Vsp(t) and the differential input signal Vsm(t) and the reference signal VCOM to an identical value, it becomes possible to equate direct current levels of the chopper output signal Vsub(t) and the addition signal Vfil(t).

Figure 7:
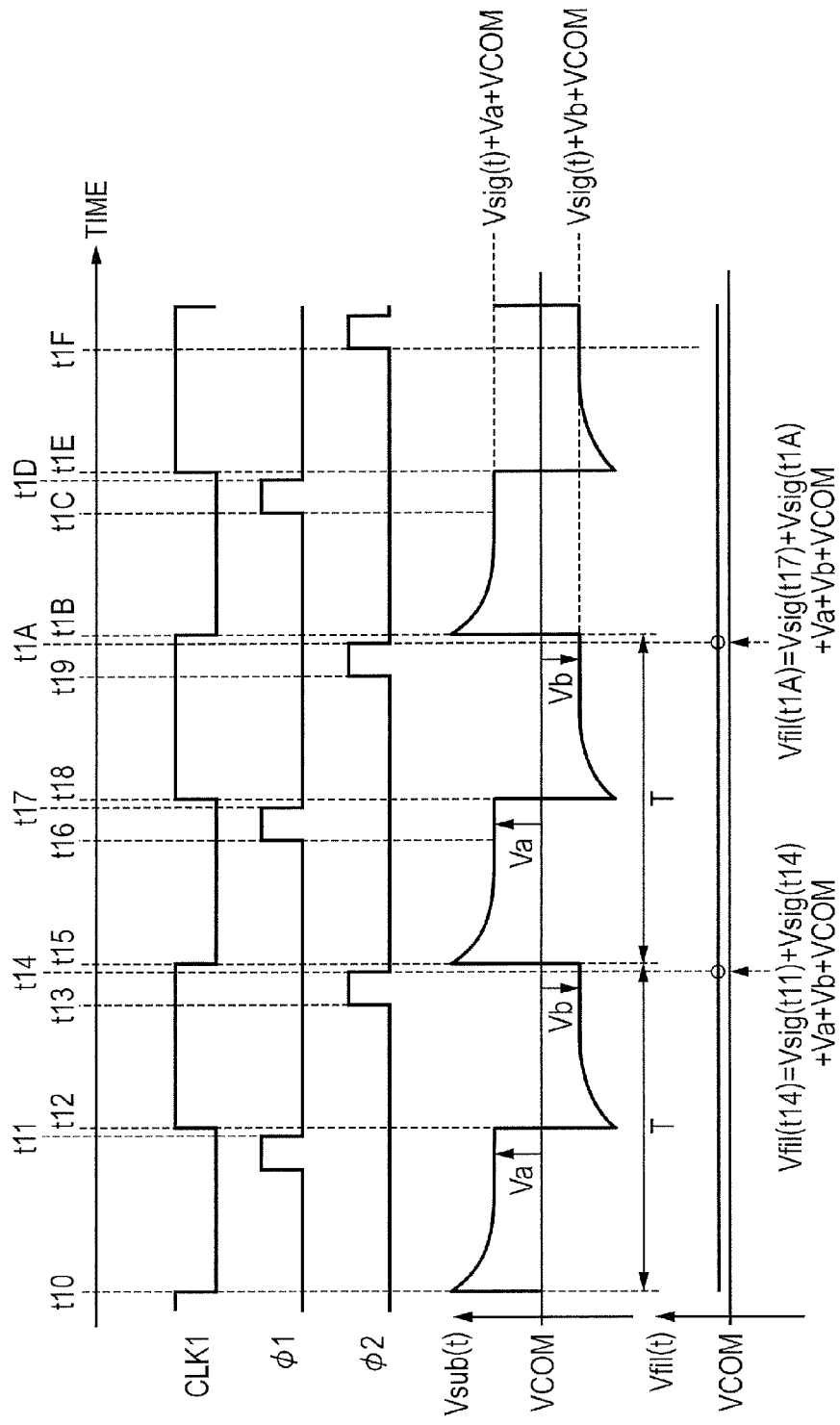
FIG. 7 is a signal waveform chart of the principal part of the signal processing circuit according to the first embodiment.

FIG. 7 shows a signal waveform of the principal part of the signal processing circuit 1 according to the first embodiment. In FIG. 7, a vertical axis schematically shows a voltage variation of the principal part, and a horizontal axis shows time. Both the vertical axis and the horizontal axis are in arbitrary scales.

A period from a time t10 to a time t15 corresponds to the period T of the chopping clock CLK1. The time t10 to a time t12 is the first phase period in which the chopping clock CLK1 becomes at the low level, and the time t12 to the time t15 is the second phase period in which the chopping clock CLK1 becomes at the high level. In the first phase period and in the second phase period, the modulation chopper circuit SA and the demodulation chopper circuit SB each interchange the signals applied to respective input nodes, and output them from respective output nodes.

The chopping clock CLK1 shifts to the second phase period from the first phase period at the time t12. The control clock $\Phi 1$ that has a predetermined pulse width returns to the low level at a time t11. The chopping clock CLK1 shifts to the first phase period from the second phase period at the time t15. The control clock $\Phi 2$ that has the same pulse width as the control clock $\Phi 1$ returns to the low level at a time t14.

As shown in FIG. 6, the adder circuit 1B samples the chopper output signal Vsub(t) in the first phase period over a generation period of the control clock $\Phi 1$. The adder circuit 1B performs an addition operation of the chopper output signal Vsub(t) in the first phase period that the arithmetic capacitive element C1 holds and the chopper output signal Vsub(t) in the second phase period over a generation period of the control clock $\Phi 2$. The addition result is outputted as the addition signal Vfil(t).

A delay time from the time t11 to the time t12 and a delay time from the time t14 to the time t15 are both set to the same time. This delay time is set up based on the delay time of the delay circuit 23 shown in FIG. 5. Moreover, occurrence times of the control clock $\Phi 1$ and the control clock $\Phi 2$ are decided based on a time when the logic level of the chopping clock CLK1 changes and a delay time of the delay circuit 22 shown in FIG. 5. Therefore, the control clock $\Phi 1$ and the control clock $\Phi 2$ are generated at timings that are shifted from each other by a half period (T/2) of the chopping clock CLK1.

Over the first phase period from the time t10 to the time t12, the chopper amplifier 1A outputs the chopper output signal Vsub(t) on which the non-inversion offset voltage Va is superimposed. Over the second phase period from the time t12 to the time t15, the chopper amplifier 1A outputs the chopper output signal Vsub(t) on which the inversion offset voltage Vb is superimposed. A vertical axis of the chopper output signal Vsub(t) shows a height of the waveform of the chopper output signal Vsub(t) in the case where the direct current level of the chopper output signal Vsub(t) is set identical to the reference signal VCOM.

At the time t10 and at the time t12, the modulation chopper circuit SA and the demodulation chopper circuit SB switch the conduction states of the switch SW4 to the switch SW1 (refer to FIG. 3). At the time of this switching of the switches, a noise is superimposed on the chopper output signal Vsub(t). This noise occurs in connection with a rapid electrical potential change between the nodes that are switched, and the chopper output signal Vsub(t) on which the noise is superimposed returns to a steady state gradually with a lapse of time.

In consideration of the influence of the noise that occurred at the time of start of the first phase period, it is desirable to set up a sampling period of the chopper output signal Vsub(t) according to the control clock $\Phi 1$ just before end of the first phase period. Similarly, it is desirable to set up the sampling period of the chopper output signal Vsub(t) according to the control clock $\Phi 2$ just before end of the second phase period. Therefore, the control circuit CTL (refer to FIG. 5) generates the control clock Φ1 and the control clock Φ2 immediately before end times of the first phase period and the second phase period, respectively.

An addition signal Vfil(t14) in one period T of the chopping clock CLK1, from the time t10 to the time t15, is obtained as follows.

When a pulse of the control clock Φ1 falls at the time t14, the adder circuit 1B outputs the addition result (Formula 33) of a value (Formula 31) of the chopper output signal Vsub(t) in the first phase period and a value (Formula 32) of the chopper output signal Vsub(t) in the second phase period as the addition signal Vfil(t14).

$$Vsub(t11)=Vsig(t11)+Va+VCOM \quad \text{Formula 31}$$

$$Vsub(t14)=Vsig(t14)+Vb+VCOM \quad \text{Formula 32}$$

$$Vfil(t14)=Vsig(t11)+Vsig(t14)+Va+Vb+VCOM \quad \text{Formula 33}$$

Where, Vsig(t) is obtained by a calculation formula shown in Formula 1. Moreover, a sign "+" is an addition sign.

Similarly, an addition signal Vfil(t1A) in one period T of the chopping clock CLK1 from the time t15 to a time t1B is obtained as follows.

When the pulse of the control clock Φ1 falls at a time t17, the adder circuit 1B outputs an addition result (Formula 43) of a value (Formula 41) of the chopper output signal Vsub(t) in the first phase period and a value (Formula 42) of the chopper output signal Vsub(t) in the second phase period is outputted as the addition signal Vfil(t1A).

$$Vsub(t17)=Vsig(t17)+Va+VCOM \quad \text{Formula 41}$$

$$Vsub(t1A)=Vsig(t1A)+Vb+VCOM \quad \text{Formula 42}$$

$$Vfil(t1A)=Vsig(t17)+Vsig(t1A)+Va+Vb+VCOM \quad \text{Formula 43}$$

Where, Vsig(t) is obtained by a calculation formula shown in Formula 1. Moreover, a sign "+" is an addition sign.

An effect of the signal processing circuit 1 according to the first embodiment is as follows. The differential input signals Vsp(t) and Vsm(t) applied to the first-stage amplifier AMP1 are interchanged by the modulation chopper circuit SA for every first phase period and second phase period. By this interchanging of the differential input signals Vsp(t) and Vsm(t), the chopper amplifier 1A outputs alternately the chopper output signal Vsub(t) on which that the non-inversion offset voltage and the inversion offset voltage are superimposed.

As a result, the offset voltage arising from the first-stage amplifier AMP1 will be superimposed on the chopper output signal Vsub(t). By addition of this chopper output signal Vsub(t) in the adder circuit 1B, an influence arising from the differential amplifier included in the chopper amplifier 1A is removed, so that the offset voltage is removed in extremely high accuracy.

The removal of the offset voltage is performed by the adder circuit 1B that uses the switched capacitor technology. In the first phase period, electric charges depending on the potential difference between the reference signal VCOM and the chopper output signal Vsub(t) on which the non-inversion offset voltage Va is superimposed are accumulated in the arithmetic capacitive element C1. In the second phase period, while the electric charges accumulated in the arithmetic capacitive element C1 are being saved, namely, a potential difference over both ends of the arithmetic capacitive element C1 is being held, the chopper output signal Vsub(t) on which the offset voltage Vb is superimposed is applied to the other end of the arithmetic capacitive element C1.

The addition result of the chopper output signal Vsub(t) on which the non-inversion offset voltage Va and the inversion offset voltage Vb are superimposed is decided by inflow/outflow of electric charges into/out of the arithmetic capacitive element C1. As a result, unlike an adder comprised of an operational amplifier etc., removal of the offset voltage is performed almost without being affected by other circuit elements.

The sampling periods of the chopper output signal Vsub(t) in the first phase period and in the second phase period are set up just before ends of the first phase period and the second phase period, respectively. That is, timings at which the control clock Φ1 and the control clock Φ2 return from the high level to the low level are set up at a time earlier than end times of the first phase period and the second phase period by a predetermined period, respectively. This predetermined period is set so as to realize a timing at which an influence of noises occurring when the first phase period and the second phase period are switched becomes sufficiently small. As a result, a value of the addition signal Vfil(t) that the adder circuit 1B outputs is stripped of errors arising from the noises.

By setting the reference signal VCOM applied to the arithmetic capacitive element C1 of the adder circuit 1B to an identical value as the direct current level of the chopper output signal Vsub(t) decided from the common voltage of the differential input signal Vsp(t) and the differential input signal Vsm(t), direct current levels of the chopper output signal Vsub(t) and the addition signal Vfil(t) can be equated. This makes it easy to design a circuit of the signal processing circuit 1.

Modification of First Embodiment

Figure 8:
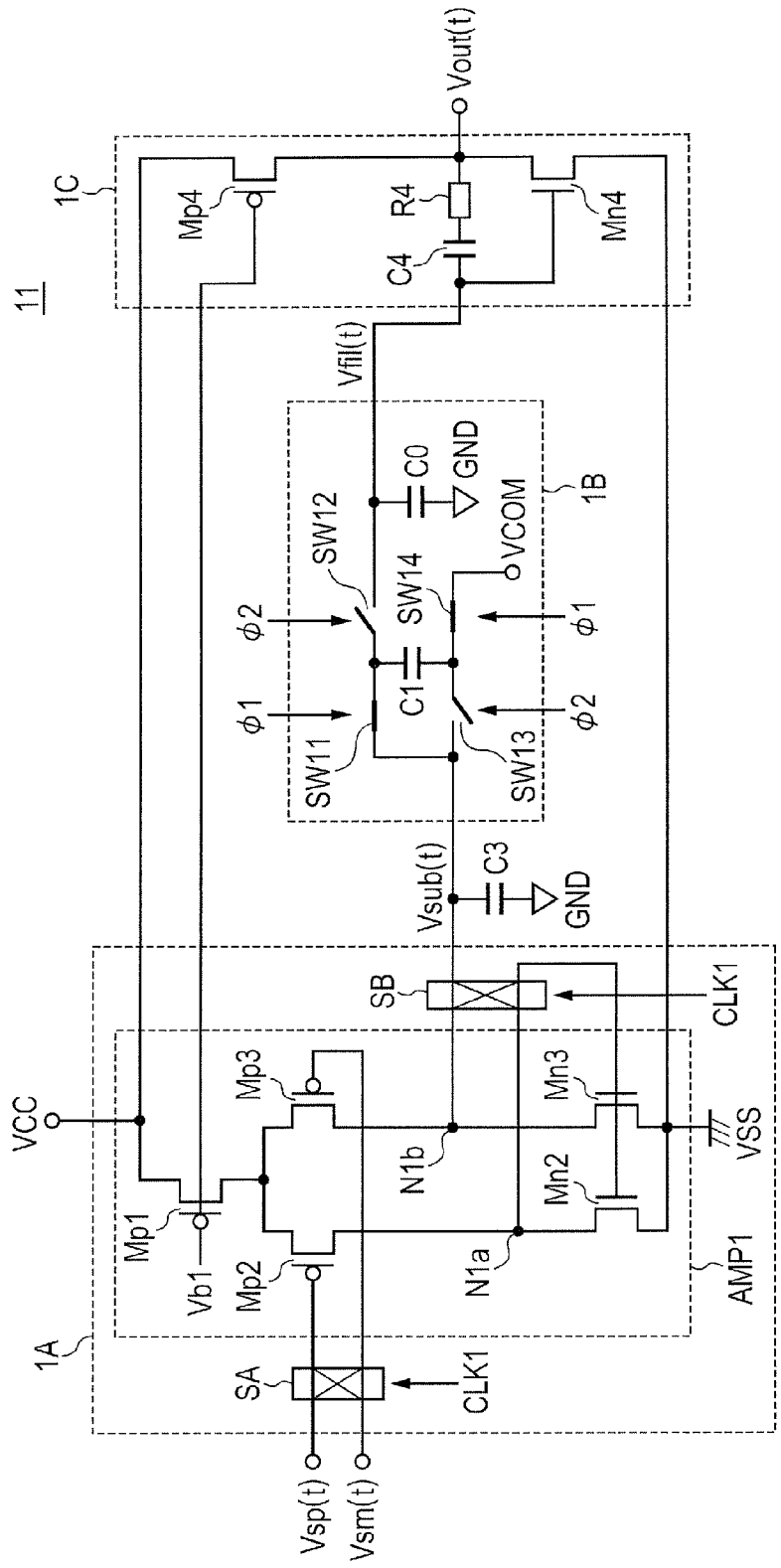
FIG. 8 is a block diagram of a modification of the signal processing circuit according to the first embodiment.

FIG. 8 shows a block diagram of a signal processing circuit 11 that is a modification of the signal processing circuit 1 according to the first embodiment.

In FIG. 8, what is given the same symbol as that of FIG. 6 has the same configuration as that of FIG. 6 and an explanation of each of these configurations is omitted.

The signal processing circuit 11 has a configuration such that a capacitive element C3 is added to a signal line that outputs the chopper output signal Vsub(t) in the signal processing circuit 1 shown in FIG. 6. In the case where a gain of the first-stage amplifier AMP1 included in the chopper amplifier 1A is high and the chopper output signal Vsub(t) varies largely close to the power source voltage VCC or the power source voltage VSS in the first phase period and in the second phase period of the chopping clock CLK1, distortion occurs in the chopper output signal Vsub(t) when it is near the power source voltage VCC or the power source voltage VSS. By this distortion of the chopper output signal Vsub, measurement accuracy of the adder circuit 1B lowers.

By adding the capacitive element C3 between the signal line that outputs the chopper output signal Vsub(t) and grounding wiring, an output waveform of the first-stage amplifier AMP1 of high gain becomes a triangular wave or a waveform that can be approximated by the triangular wave.

Figure 9:
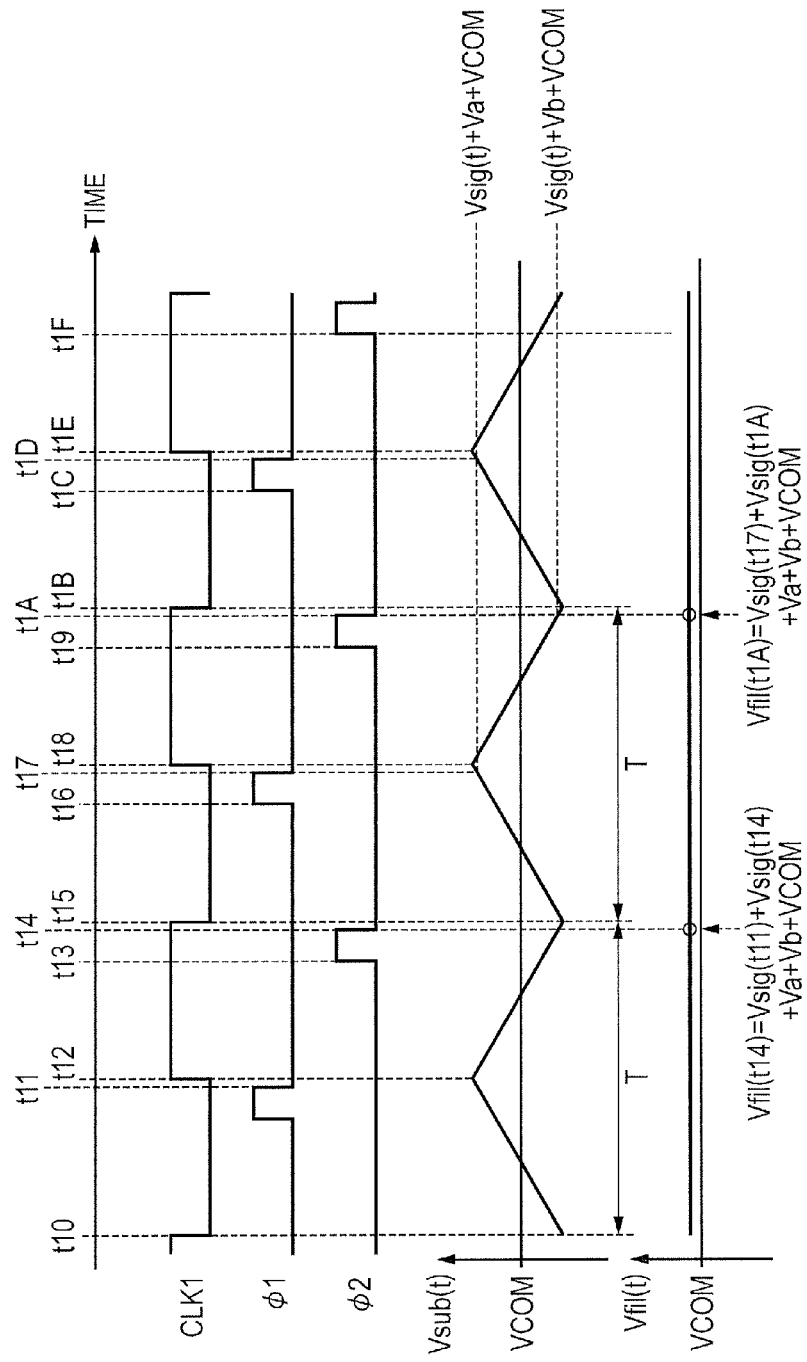
FIG. 9 is a signal waveform chart of a principal part of the modification of the signal processing circuit according to the first embodiment.

FIG. 9 shows a signal waveform of a principal part of the signal processing circuit 11 that is the modification of the signal processing circuit 1 according to the first embodiment.

The waveform of the chopper output signal Vsub(t) in FIG. 9 differs from an operation waveform chart of the principal part of FIG. 8. Variations on vertical axes both in FIG. 9 and FIG. 8 (voltage) to the horizontal axis (time) of other waveforms are the same, and their duplicated explanations are omitted.

In the signal processing circuit 11, the output waveform of the first-stage amplifier AMP1 of high gain is approximated to a triangular wave having a predetermined gradient by adding the capacitive element C3 to the signal line that outputs the chopper output signal Vsub(t). It becomes possible to set the value of the chopper output signal Vsub(t) in the sampling periods of the control clock Φ1 and the control clock Φ2 to the same extent as the case of the signal processing circuit 1 by appropriately selecting a capacity value of the capacitive element C3.

Second Embodiment

Figure 10:
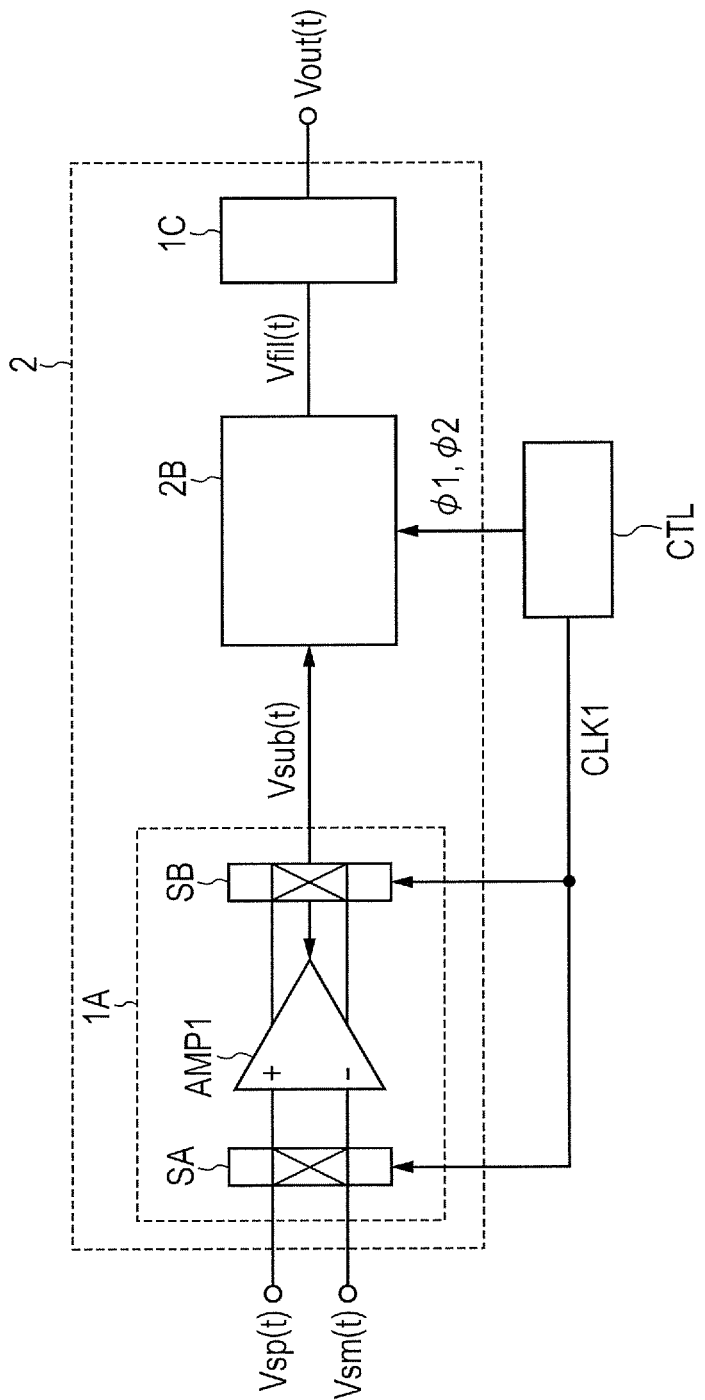
FIG. 10 is a block diagram of a signal processing circuit according to a second embodiment.

FIG. 10 shows a block diagram of a signal processing circuit 2 according to a second embodiment.

In FIG. 10, what is given the same symbol as that of FIG. 1 has the same configuration as that of FIG. 1, and an explanation of each of these configurations is omitted.

The signal processing circuit 2 is equivalent to a configuration such that the adder circuit 1B in FIG. 1 is replaced with an adder circuit 2B.

The signal processing circuit 2 has the chopper amplifier 1A, the adder circuit 2B, and the output-stage amplifier 1C. The chopper amplifier 1A has the modulation chopper circuit SA, the first-stage amplifier AMP1, and the demodulation chopper circuit SB. In the modulation chopper circuit SA and the demodulation chopper circuit SB, their chopping operations are controlled by the chopping clock CLK1 that the control circuit CTL outputs. In the adder circuit 2B, its operation is controlled by the control clock Φ1 and the control clock Φ2 that the control circuit CTL outputs.

Figure 11:
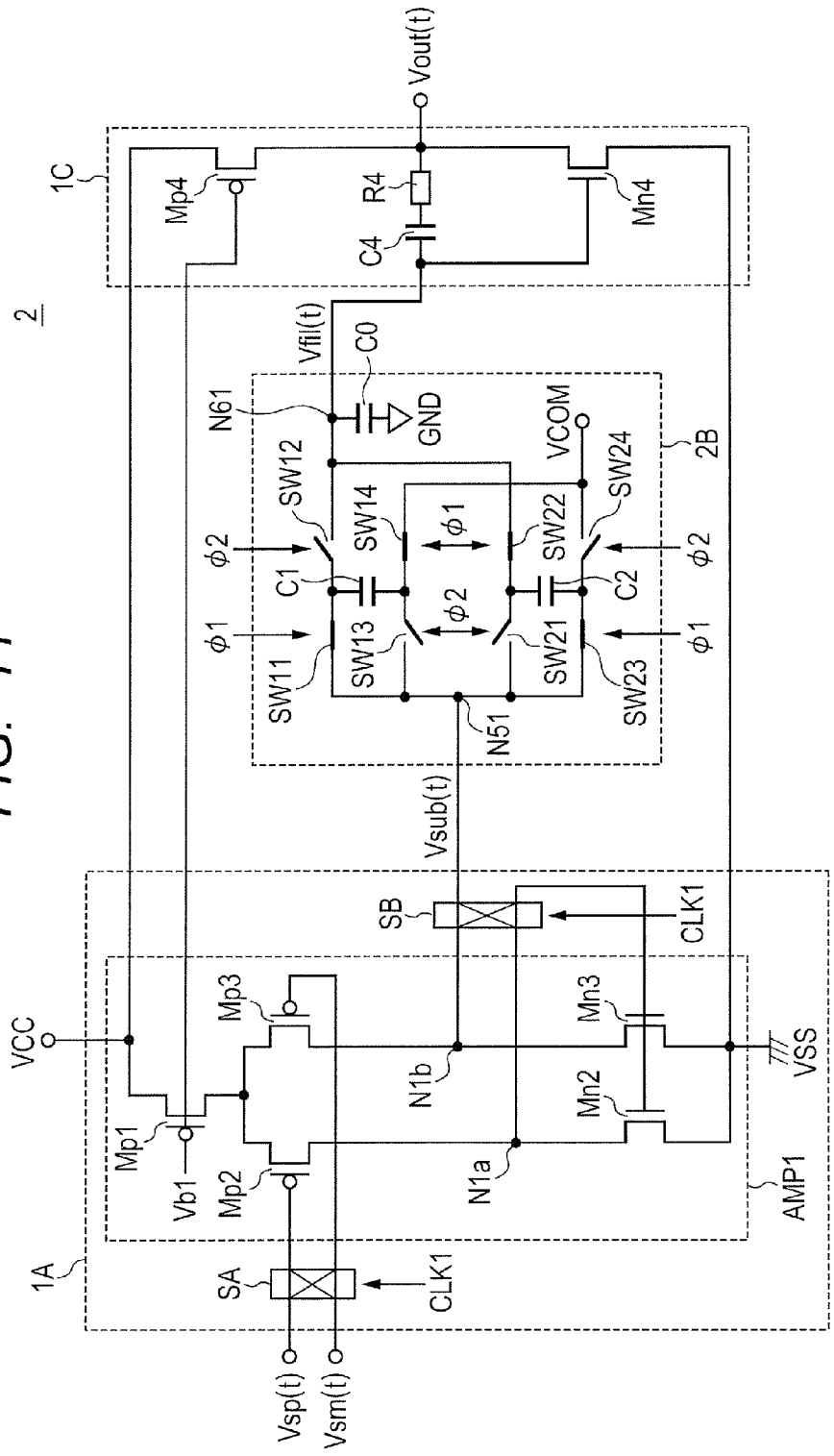
FIG. 11 is a circuit diagram of an adder circuit included in the signal processing circuit according to the second embodiment.

FIG. 11 is a circuit diagram of the adder circuit 2B included in the signal processing circuit 2 according to the second embodiment. The adder circuit 2B generates the addition signal Vfil(t) obtained by adding the chopper output signal Vsub(t) on which the non-inversion offset voltage Va is superimposed and the chopper output signal Vsub(t) on which the inversion offset voltage Vb is superimposed for every half period of the chopping clock CLK1.

The adder circuit 2B has the switch SW11, the switch SW12, the switch SW13, the switch SW14, a switch SW21, a switch SW22, a switch SW23, a switch SW24, the capacitive element C0, the arithmetic capacitive element C1, and an arithmetic capacitive element C2. Between a node N51 and a node N61, two adder circuits that use the switched capacitor technology are coupled in parallel.

The first adder circuit has the switch SW11, the switch SW12, the switch SW13, the switch SW14, and the arithmetic capacitive element C1. The switch SW11 and the switch SW13 are coupled between the node N51 and one end and the other end of the arithmetic capacitive element C1, respectively. The switch SW12 is coupled between the node N61 and one end of the arithmetic capacitive element C1. One end of the switch SW14 is coupled to the other end of the arithmetic capacitive element C1, and the reference signal VCOM is applied to the other end of the switch SW14.

The second adder circuit has the switch SW21, the switch SW22, the switch SW23, the switch SW24, and the arithmetic capacitive element C2. The switch SW23 and the switch SW21 are coupled between the node N51 and one end and the other end of the arithmetic capacitive element C2, respectively. The switch SW22 is coupled between the node N61 and the other end of the arithmetic capacitive element C2. One end of the switch SW24 is coupled to the one end of the arithmetic capacitive element C2, and the reference signal VCOM is applied to the other end of the switch SW24.

One end of the capacitive element C0 is coupled with the node N61, and the ground voltage GND is applied to the other end thereof. The capacitive element C0 holds a voltage applied to the node N61.

In the first adder circuit, the chopper output signal Vsub(t) is inputted into the node N51, and the addition signal Vfil(t) is outputted from the node N61. The conduction states of the switch SW11 and the switch SW14 are controlled by the control clock Φ1, and the conduction states of the switch SW12 and the switch SW13 are controlled by the control clock Φ2. Furthermore, the conduction states of the switch SW11 and the switch SW14 and the conduction states of the switch SW12 and the switch SW13 are controlled so as to be contrary to each other.

For example, over the period in which the control clock Φ1 is a the high level (the period in which the control clock Φ2 is at the low level), the switch SW11 and the switch SW14 are set to be in the conduction state, and the switch SW12 and the switch SW13 are set to be in the non-conduction state. On the other hand, over the period in which the control clock Φ2 is at the high level (the period in which the control clock Φ1 is at the low level), the switch SW12 and the switch SW13 are set to be in the conduction state, and the switch SW11 and the switch SW14 are set to be in the non-conduction state.

On the other hand, in the second adder circuit, the chopper output signal Vsub(t) is inputted into the node N51, and the addition signal Vfil(t) is outputted from the node N61. The conduction states of the switch SW21 and the switch SW24 are controlled by the control clock Φ2, and the conduction states of the switch SW22 and the switch SW23 are controlled by the control clock Φ1. Furthermore, the conduction states of the switch SW21 and the switch SW24 and the conduction states of the switch SW22 and the switch SW23 are controlled so as to be contrary to each other.

The conduction states of the SW11/SW14 and the SW22/SW23 and the conduction states of the SW12/SW13 and the SW21/SW24 are controlled so as to be contrary to each other.

For example, over the period in which the control clock Φ1 is at the high level (the period in which the control clock Φ2 is at the low level), the switch SW11, the switch SW14, the switch SW22, and the switch SW23 are set to be in the conduction state, and the switch SW12, the switch SW13, the switch SW21, and the switch SW24 are set to be in the non-conduction state. Incidentally, the adder circuit 2B shown in FIG. 11 schematically shows this status.

Figure 12:
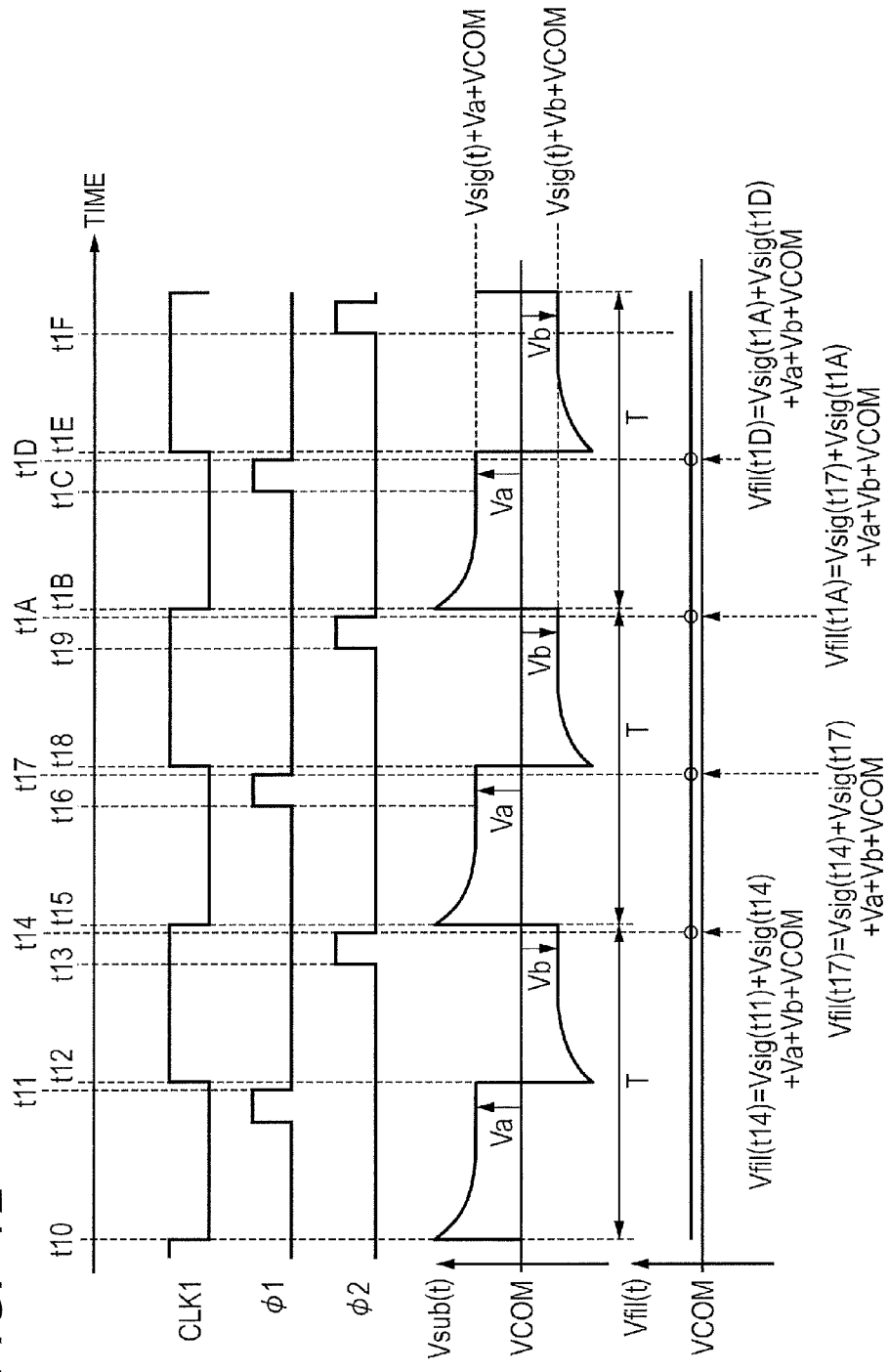
FIG. 12 is a signal waveform chart of a principal part of the signal processing circuit according to the second embodiment.

On the other hand, over the period in which the control clock Φ2 is at the high level (the period in which the control clock Φ1 is at the low level), the conduction states of the switch SW11 to the switch SW14 and those of the switch SW21 to the switch SW24 become contrary to the case in the period in which the control clock Φ1 is at the high level FIG. 12 shows a signal waveform of a principal part of the signal processing circuit 2 according to the second embodiment. In FIG. 12, a vertical axis schematically shows a voltage variation of the principal part, and a horizontal axis shows time. The vertical axis and the horizontal axis are in arbitrary scales.

A period from the time t10 to the time t15 corresponds to the period T of the chopping clock CLK1. The time t10 to the time t12 is the first phase period in which the chopping clock CLK1 becomes the low level, and the time t12 to the time t15 is the second phase period in which the chopping clock CLK1 becomes the high level. In the first phase period and in the second phase period, each of the modulation chopper circuit SA and the demodulation chopper circuit SB interchanges the signals applied to its input nodes, and output them from its output nodes.

In the first phase period starting from the time t10, the chopper amplifier 1A outputs the chopper output signal Vsub(t) on which the non-inversion offset voltage Va is superimposed. In response to the control clock Φ1, the first adder circuit samples a value of the chopper output signal Vsub(t) at the time t11. The value is designated as Vsub(t11).

In the second phase period starting from the time t12, the chopper amplifier 1A outputs the chopper output signal Vsub (t) on which the inversion offset voltage Vb is superimposed. In response to the control clock Φ2, the first adder circuit outputs an additional value (=Vfil(t14)) of a value of the chopper output signal Vsub(t) at the time t14 (=Vsub(t14)) and the chopper output signal Vsub(t11).

$$Vfil(t14)=Vsig(t11)+Va+Vsig(t14)+Vb+VCOM \quad \text{Formula 51}$$

Where, a sign "+" is an addition sign.

In the second phase period starting from the time t12, in response to the control clock Φ2, the second adder circuit samples a value (=Vsub(t14)) of the chopper output signal Vsub(t) at the time t14. That is, in the second phase period, generation of the addition signal Vfil(t) in the first adder circuit and sampling of the chopper output signal Vsub(t) in the second adder circuit are performed simultaneously.

In the first phase period starting from the time t15, the chopper amplifier 1A outputs the chopper output signal Vsub (t) on which the non-inversion offset voltage Va is superimposed. In response to the control clock Φ1, the first adder circuit samples a value of the chopper output signal Vsub(t) at the time t17. The value is designated as Vsub(t17).

In this first phase period, in response to the control clock Φ1, the second adder circuit outputs an additional value (=Vfil(t17)) of the chopper output signal Vsub(t) at the time t17 (=Vsub(t17)) and the chopper output signal Vsub(t14).

$$Vfil(t17)=Vsig(t14)+Vb+Vsig(t17)+Va+VCOM \quad \text{Formula 52}$$

Where, a sign "+" is an addition sign.

That is, in the first phase period, generation of the addition signal Vfil(t) in the second adder circuit and sampling of the chopper output signal Vsub(t) in the first adder circuit are performed simultaneously.

In the second phase period starting from a time t18 and afterward, the first adder circuit and the second adder circuit perform the same processing.

An effect of the signal processing circuit 2 according to the second embodiment is as follows. The adder circuit 2B generates the addition signal Vfil(t) obtained by addition of the chopper output signal Vsub(t) on which the non-inversion offset voltage and the inversion offset voltage are superimposed for every half period of the chopping clock CLK1. As a result, as compared with the adder circuit 1B that included in the signal processing circuit 1 according to the first embodiment, it becomes possible for the adder circuit 2B to make small a delay time from generation of the chopper output signal Vsub(t) by the chopper amplifier 1A to the generation of the addition signal Vfil(t) by the adder circuit 2B, which makes it possible to remove the offset voltage in higher accuracy.

Modification of Second Embodiment

Figure 13:
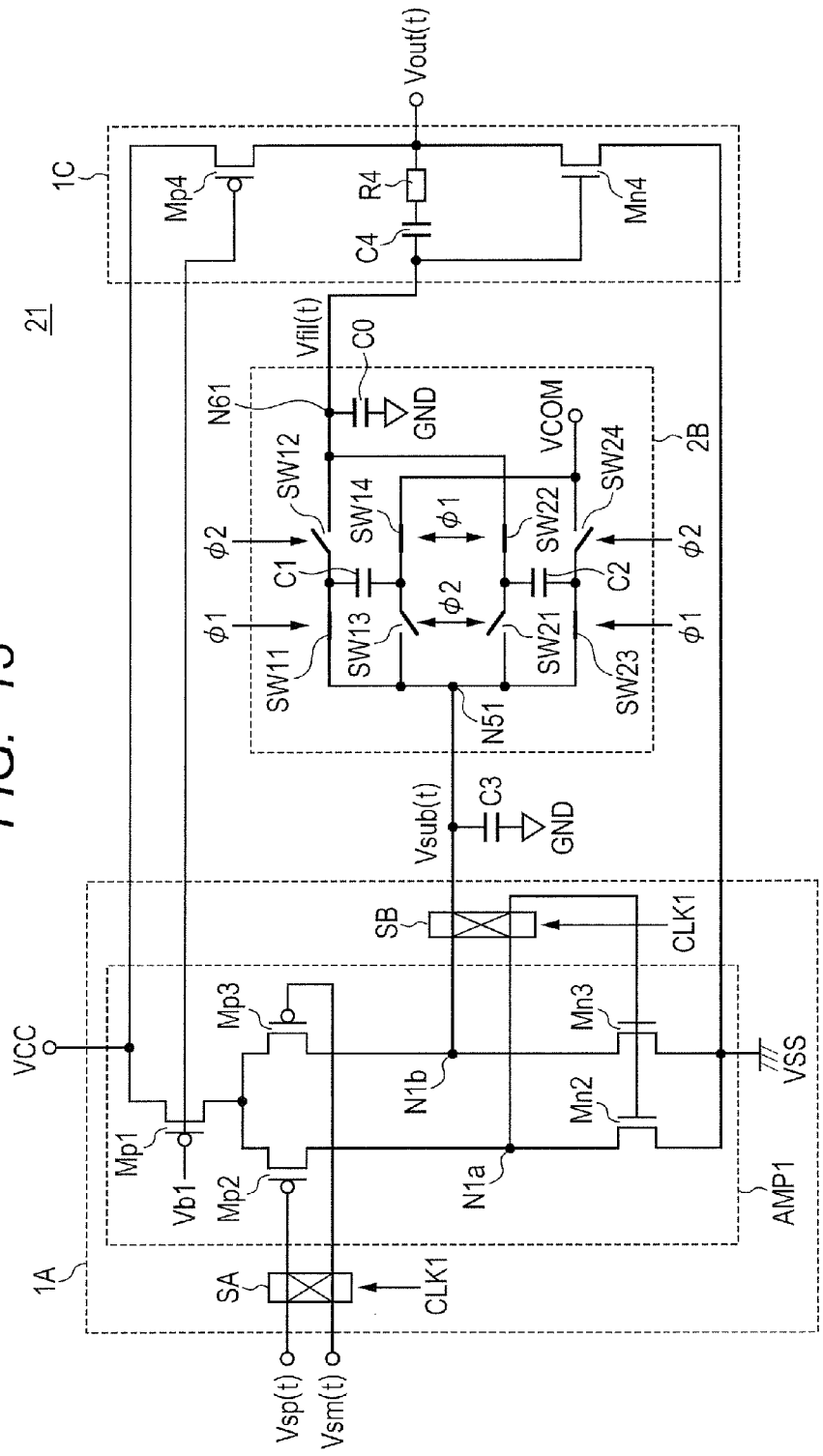
FIG. 13 is a block diagram of a modification of the signal processing circuit according to the second embodiment.

FIG. 13 shows a block diagram of a signal processing circuit 21 that is a modification of the signal processing circuit 2 according to the second embodiment.

In FIG. 13, what is given the same symbol as that of FIG. 11 has the same configuration as that of FIG. 1, and an explanation of each of these configurations is omitted.

The signal processing circuit 21 has a configuration such that the capacitive element C3 is added to the signal line that outputs the chopper output signal Vsub(t) in the signal processing circuit 2 shown in FIG. 11. An action and an effect of the capacitive element C3 are the same as those of the signal processing circuit 11 shown in FIG. 8.

Third Embodiment

Figure 14:
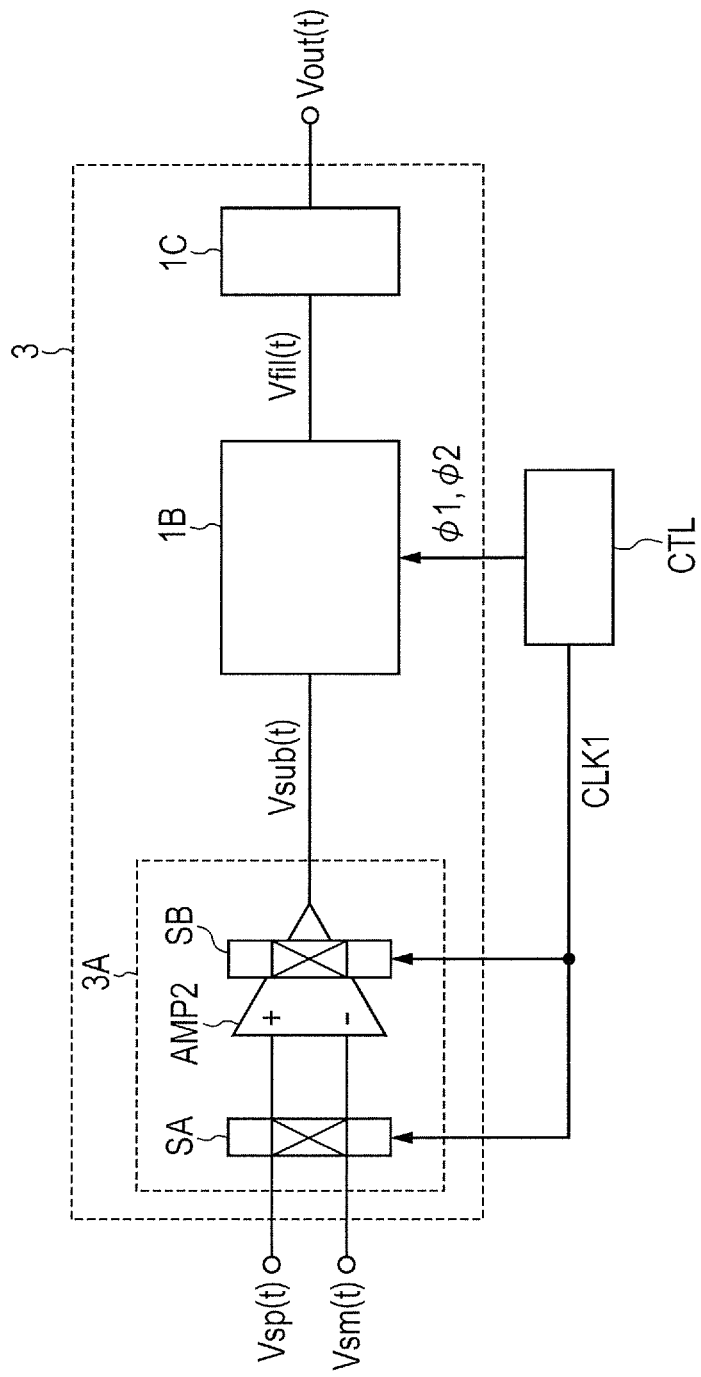
FIG. 14 is a block diagram of a signal processing circuit according to a third embodiment.

FIG. 14 shows a block diagram of a signal processing circuit 3 according to a third embodiment.

In FIG. 14, what is given the same symbol as that of FIG. 1 has an identical configuration to that of FIG. 1, and an explanation of each of these configurations is omitted. That is, the signal processing circuit 3 has a configuration in which the chopper amplifier 1A is replaced with a chopper amplifier 3A in the signal processing circuit 1 shown in FIG. 1.

The signal processing circuit 3 has the chopper amplifier 3A, the adder circuit 1B, and the output-stage amplifier 1C. The chopper amplifier 3A has the modulation chopper circuit SA and a configuration in which the two-stage single-ended amplifier and the demodulation chopper circuit SB are combined. In the modulation chopper circuit SA and the demodulation chopper circuit SB, their chopping operations are controlled by the chopping clock CLK1 that the control circuit CTL outputs. In the adder circuit 1B, its operation is controlled by the control clock Φ1 and the control clock Φ2 that the control circuit CTL outputs.

Figure 15:
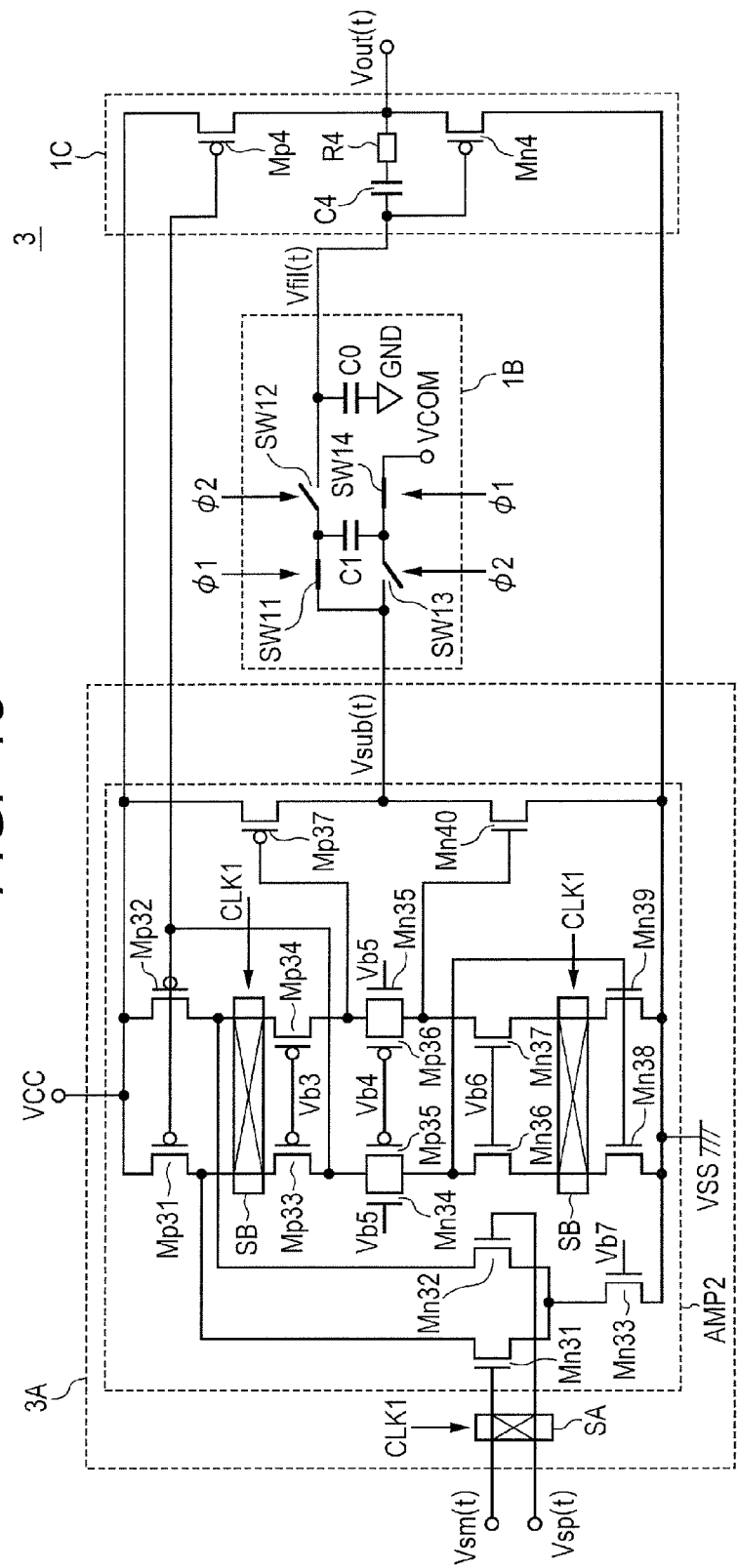
FIG. 15 is a circuit diagram of the signal processing circuit according to the third embodiment.

FIG. 15 shows a circuit diagram of the signal processing circuit 3 according to the third embodiment. The chopper amplifier 3A has the modulation chopper circuit SA, a first-stage amplifier AMP2, and two demodulation chopper circuits SB. The first-stage amplifier AMP2 is a concrete example of a two-stage single-ended amplifier, and has a configuration of a folded cascode class AB amplifier.

The first-stage amplifier AMP2 includes a difference input stage, a cascode current mirror circuit on the power source voltage VCC side, a cascode current mirror circuit on the power source voltage VSS side, and an output stage.

The difference input stage of the first-stage amplifier AMP2 is comprised of n-type transistors Mn31, Mn32, and Mn33. The differential input signal Vsp(t) and the differential input signal Vsm(t) are applied to respective gates of the n-type transistors Mn31 and Mn32 through the modulation chopper circuit SA. Sources of the n-type transistors Mn31 and Mn32 are coupled with a drain of the n-type transistor Mn33 that is a constant current source. A bias voltage Vb7 and the power source voltage VSS are applied to a gate and the source of the n-type transistor Mn33, respectively.

The cascode current mirror circuit on the power source voltage VCC side has p-type transistors Mp32 and Mp34 that are cascode coupled and p-type transistors Mp31 and Mp33 that are cascode coupled. Drains of the p-type transistors Mp31 and Mp32 are coupled with sources of the p-type transistors Mp33 and Mp34, respectively, through a first demodulation chopper circuit SB. A drain of the p-type transistor Mp33 is coupled with gates of the p-type transistors Mp31 and Mp32.

The cascode current mirror circuit on the power source voltage VSS side has n-type transistors Mn36 and Mn38 that are cascode coupled and n-type transistors Mn37 and Mn39 that are cascode coupled. Sources of the n-type transistors Mn36 and Mn37 are coupled with drains of the n-type transistors Mn38 and Mn39, respectively, through a second demodulation chopper circuit SB. A drain of the n-type transistor Mn36 is coupled with gates of the n-type transistors Mn38 and Mn39.

Drains of the n-type transistors Mn31 and Mn32 included in the difference input stage are coupled with the drains of the p-type transistors Mp31 and Mp32 included in the cascode current mirror circuit on the power source voltage VCC side, respectively. That is, the difference input stage is folded cascode coupled with the cascode current mirror circuit on the power source voltage VCC side.

The differential input signals Vsp(t) and Vsm(t) that were interchanged for every half period of the chopping clock CLK1 are applied to the difference input stage through the modulation chopper circuit SA. Respective cascode current mirror circuits on the power source voltage VCC side and on the power source voltage VSS side output differential output signals obtained by amplifying and demodulating the differential input signals Vsp(t) and Vsm(t) that the modulation chopper circuit SA outputs, working together with the first demodulation chopper circuit SB and the second demodulation chopper circuit SB included in the respective circuits, to an output stage of the first-stage amplifier AMP2.

The output stage of the first-stage amplifier AMP2 has a p-type transistor Mp37 and an n-type transistor Mn40 that perform a push-pull operation. The power source voltage VCC is applied to a source of the p-type transistor Mp37, and its drain is coupled with a drain of the n-type transistor Mn40. The power source voltage VSS is applied to a source of the n-type transistor Mn40.

A bias circuit for making the output stage of the first-stage amplifier perform a class AB operation is inserted between the cascode current mirror circuit on the power source voltage VCC side and the cascode current mirror circuit on the power source voltage VSS side. This bias circuit has a pair of an n-type transistor Mn34 and a p-type transistor Mp35 and a pair of an n-type transistor Mn35 and the p-type transistor Mn36. A bias voltage Vb4 is applied to gates of the p-type transistors Mp35 and Mp36, and a bias voltage Vb5 is applied to gates of the n-type transistors Mn34 and Mn35.

A drain of the p-type transistor Mp34, a source of the p-type transistor Mp36, and a drain of the n-type transistor Mn35 are coupled mutually, and a voltage of their junction points is applied to a gate of the p-type transistor Mp37. A drain of the p-type transistor Mp36, a source of the n-type transistor Mn35, and a drain of the n-type transistor Mn37 are coupled mutually, and a voltage of their junction points is applied to a gate of the n-type transistor Mn40.

By controlling the modulation chopper circuit SA and the two demodulation chopper circuits SB with the chopping clock CLK1, the chopper amplifier 3A outputs the chopper output signal Vsub(t) on which the non-inversion offset voltage is superimposed and the chopper output signal Vsub(t) on which the inversion offset voltage is superimposed alternately for every half period of the chopping clock CLK1.

The adder circuit 1B generates the addition signal Vfil(t) obtained by adding the chopper output signal Vsub(t) on which the non-inversion offset voltage is superimposed on the basis of the reference signal VCOM and the chopper output signal Vsub(t) on which the inversion offset voltage is superimposed similarly. The output-stage amplifier 1C outputs the output signal Vout(t) of the signal processing circuit 3 by amplifying the addition signal Vfil(t).

The folded cascode class AB amplifier was explained as an example of the two-stage single-ended amplifier in the signal processing circuit 3. The two-stage single-ended amplifier is not limited to it, and may be changed to an amplifier circuit that has a cascode differential amplifier or a Rail-to-Rail input differential stage.

Modification of Third Embodiment

Figure 16:
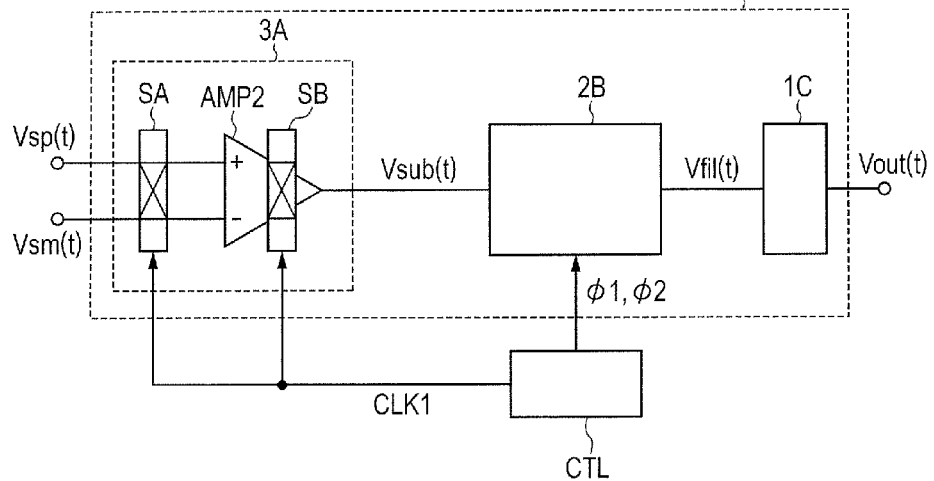
FIG. 16 is a block diagram of a modification of the signal processing circuit according to the third embodiment.

FIG. 16 shows a block diagram of a signal processing circuit 31 that is a modification of the signal processing circuit 3 according to the third embodiment.

In FIG. 16, what is given the same symbol as that of FIG. 14 has the same configuration as that of FIG. 14, and an explanation of each of these configurations is omitted. That is, the signal processing circuit 31 has a configuration such that the adder circuit 1B is replaced with the adder circuit 2B in the signal processing circuit 3 shown in FIG. 16.

The signal processing circuit 31 has the chopper amplifier 3A, the adder circuit 2B, and the output-stage amplifier 1C. A concrete configuration of the adder circuit 2B is shown in FIG. 11.

The adder circuit 2B generates the addition signal Vfil(t) obtained by addition of the chopper output signal Vsub(t) outputted by the first-stage amplifier AMP2 comprised of a two-stage single-ended amplifier for every half period of the chopping clock CLK1. The first-stage amplifier AMP2 outputs alternately the chopper output signal Vsub(t) on which the non-inversion offset voltage and the inversion offset voltage are superimposed for every half period of the chopping clock CLK1. Therefore, the signal from which the influence of the offset voltage of the two-stage single-ended amplifier was removed by the adder circuit 2B is outputted from the output-stage amplifier 1C.

The signal processing circuit 31 has a configuration in which the two-stage single-ended amplifier and the adder circuit 2B are combined. As a result, a time to generate the addition signal Vfil(t) from the chopper output signal Vsub(t) is further shortened, and it becomes possible to speed up the operation of the signal processing circuit 3.

Fourth Embodiment

Figure 17:
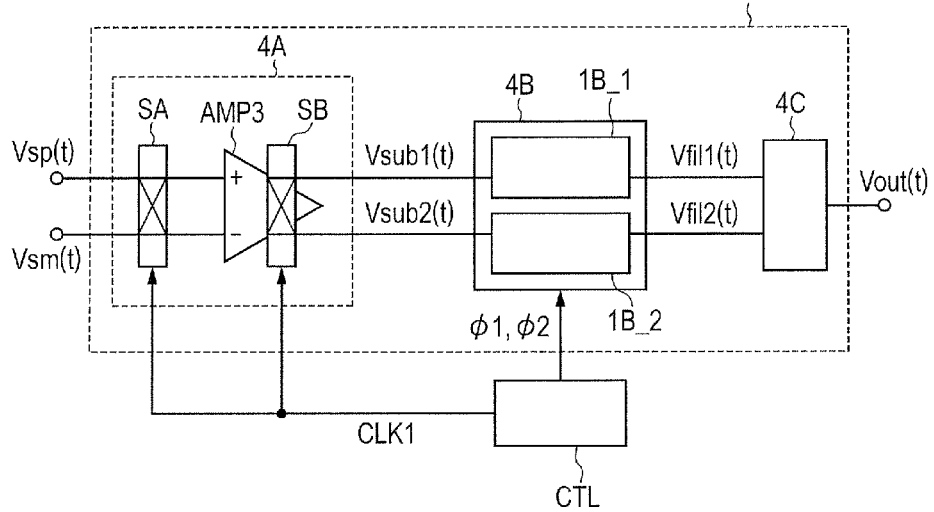
FIG. 17 is a block diagram of a signal processing circuit according to a fourth embodiment.

FIG. 17 shows a block diagram of a signal processing circuit 4 according to a fourth embodiment.

The signal processing circuit 4 has a chopper amplifier 4A, an adder 4B, and an output-stage amplifier 4C. The chopper amplifier 4A has the modulation chopper circuit SA and a configuration in which the demodulation chopper circuit SB is combined with a whole differential amplifier. In the modulation chopper circuit SA and the demodulation chopper circuit SB, their chopping operations are controlled by the chopping clock CLK1 that the control circuit CTL outputs The differential input signal Vsp(t) and the differential input signal Vsm(t) are inputted into the modulation chopper circuit SA. In the first phase period of the chopping clock CLK1, the chopper amplifier 4A outputs the chopper output signal $Vsub1(t)$ on which the non-inversion offset voltage is superimposed and the chopper output signal $Vsub2(t)$ on which the inversion offset voltage is superimposed. Furthermore, in the second phase period of the chopping clock CLK1, the chopper amplifier 4A outputs the chopper output signal $Vsub1(t)$ on which the inversion offset voltage is superimposed and the chopper output signal $Vsub2(t)$ on which the non-inversion offset voltage is superimposed.

The adder circuit 4B has an adder circuit 1B_1 and an adder circuit 1B_2 both having the same configuration as that of the adder circuit 1B shown in FIG. 1. The adder circuit 1B_1 and the adder circuit 1B_2 each add the chopper output signal $Vsub1(t)$ and the chopper output signal $Vsub2(t)$ for every period of the chopping clock CLK1, respectively. The adder circuit 4B outputs addition results of the chopper output signal $Vsub1(t)$ and the chopper output signal $Vsub2(t)$ as an addition signal $Vfil1(t)$ and an addition signal $Vfil2(t)$, respectively.

The output-stage amplifier 4C is a single ended amplifier circuit, which outputs an output signal Vout(t) of the signal processing circuit 4 based on the addition signal $Vfil1(t)$ and the addition signal $Vfil2(t)$.

Figure 18:
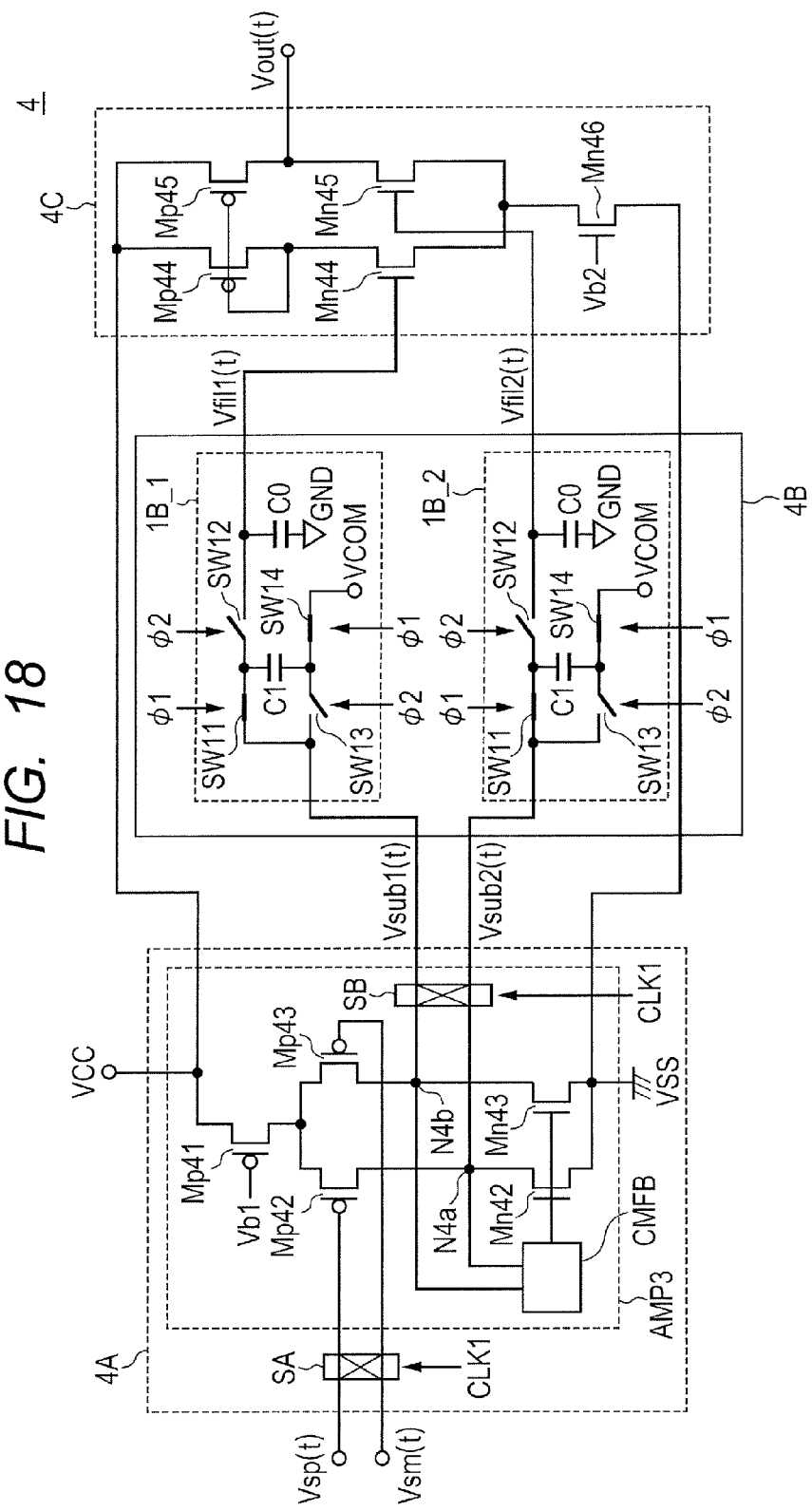
FIG. 18 is a circuit diagram of the signal processing circuit according to the fourth embodiment.

FIG. 18 a circuit diagram of the signal processing circuit 4 according to the fourth embodiment. The chopper amplifier 4A has the modulation chopper circuit SA, a first-stage amplifier AMP3, and the demodulation chopper circuit SB.

The first-stage amplifier AMP3 has: a p-type transistor Mp41, a p-type transistor Mp42, and a p-type transistor Mp43; an n-type transistor Mn42, and an n-type transistor Mn43; and a common mode feedback circuit CMFB. The power source voltage VCC is applied to a source of the p-type transistor Mp41, and its drain is coupled with sources of the p-type transistor Mp42 and the p-type transistor Mp43. The bias voltage Vb1 is applied to a gate of the p-type transistor Mp41.

Drains of the p-type transistor Mp42 and the p-type transistor Mp43 are coupled with drains of the n-type transistor Mn42 and the n-type transistor Mn43 through a node N4a and a node N4b, respectively. The power source voltage VSS is applied to sources of the n-type transistor Mn42 and the n-type transistor Mn43. Gates of the n-type transistor Mn42 and the n-type transistor Mn43 are coupled with each other and are coupled with an output of the common mode feedback circuit CMFB. The common mode feedback circuit CMFB controls currents of the n-type transistor Mn42 and the n-type transistor Mn43 based on inputted potentials of the node N4a and the node N4b.

One input node and the other input node of the demodulation chopper circuit SB are coupled with the node N4a and the node N4b, respectively. One output node and the other output node of the demodulation chopper circuit SB are coupled with an input node of the adder circuit 1B_1 and the adder circuit 1B_2, respectively.

The adder circuit 1B_1 and the adder circuit 1B_2 included in the adder circuit 4B have the same configuration as that of the adder circuit 1B shown in FIG. 1, as described above.

The output-stage amplifier 4C has p-type transistors Mp44 and Mp45 and n-type transistors Mn44, Mn45, and Mn46. The power source voltage VCC is applied to sources of the p-type transistors Mp44 and Mp45. A drain of the n-type transistor Mn44 is coupled with gates of the p-type transistors Mp44 and Mp45, a drain of the p-type transistor Mp45 is coupled with a drain of the n-type transistor Mn45, and outputs the output signal Vout(t) of the signal processing circuit 4.

The addition signal Vfil1(t) and the addition signal Vfil2(t) are applied to gates of the n-type transistors Mn44 and Mn45, respectively. Sources of the n-type transistors Mn44 and Mn45 are coupled with a drain of the n-type transistor Mn46. A bias voltage Vb2 and the power source voltage VSS are applied to a gate and a source of the n-type transistor Mn46, respectively, which operates as a current source.

In the signal processing circuit 4, the output-stage amplifier 4C is comprised of a single ended amplifier. The output-stage amplifier 4C is not limited to that configuration, and may be comprised of a whole differential amplifier.

Modification of Fourth Embodiment

Figure 19:
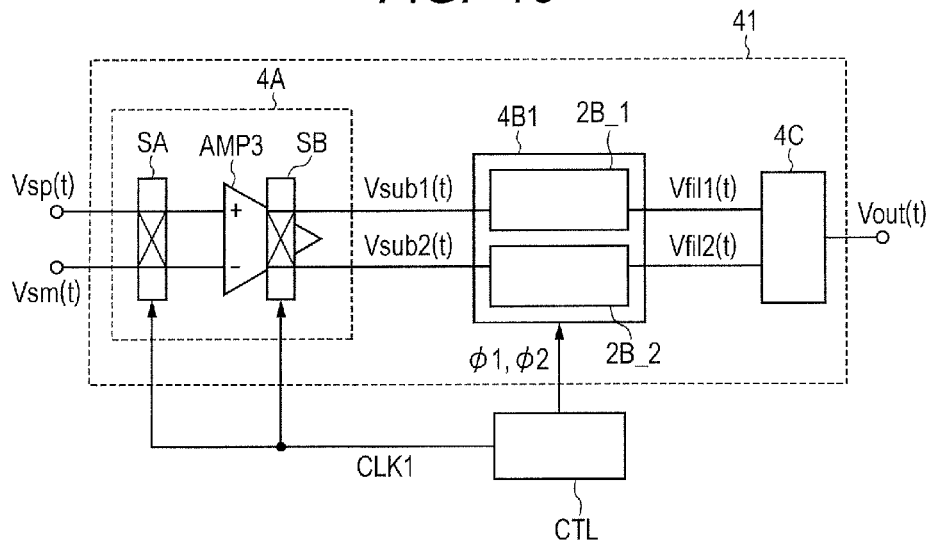
FIG. 19 is a block diagram of a modification of the signal processing circuit according to the fourth embodiment.

FIG. 19 shows a block diagram of a signal processing circuit 41 that is a modification of the signal processing circuit 4 according to the fourth embodiment.

In FIG. 19, what is given the same symbol as that of FIG. 17 has the same configuration as that of FIG. 17, and an explanation of each of these configurations is omitted.

The signal processing circuit 41 is equivalent to a configuration such that the adder circuit 4B is replaced with an adder circuit 4B1 in the signal processing circuit 4. The adder circuit 4B1 has an adder circuit 2B_1 and an adder circuit 2B_2. Each of the adder circuit 2B_1 and the adder circuit 2B_2 has the same configuration as that of the adder circuit 2B shown in FIG. 11. That is, the adder circuit 4B1 obtains the chopper output signal Vsub1(t) and the chopper output signal Vsub2(t) on which the non-inversion offset voltage and the inversion offset voltage are superimposed, respectively, for each half period of the chopping clock CLK1, and outputs the addition results as the addition signal Vfil1(t) and the addition signal Vfil2(t), respectively.

Fifth Embodiment

Figure 20:
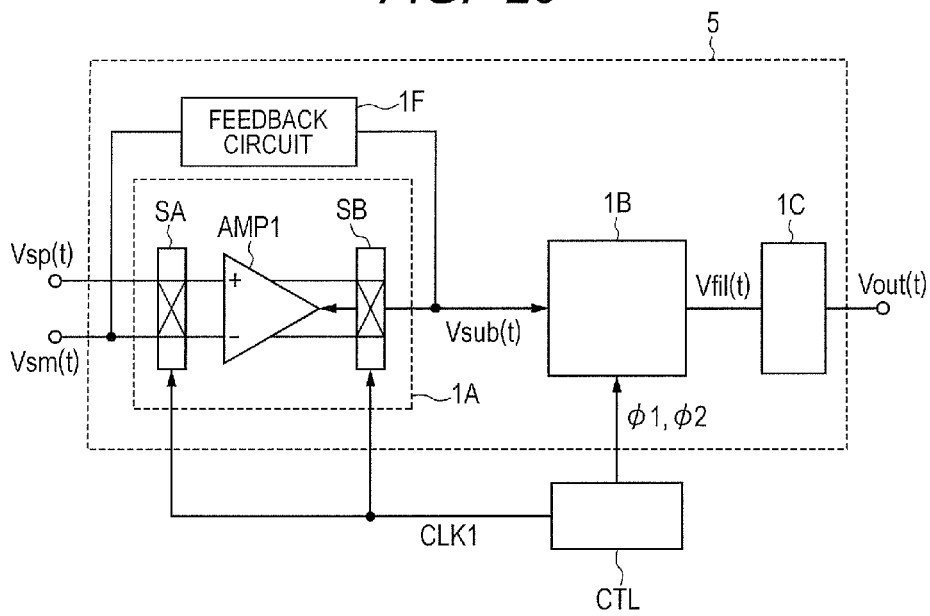
FIG. 20 is a block diagram of a signal processing circuit according to a fifth embodiment.

FIG. 20 shows a block diagram of a signal processing circuit 5 according to a fifth embodiment.

In FIG. 20, what is given the same symbol as that of FIG. 1 has the same configuration as that of FIG. 1, an explanation of each of these configurations is omitted.

The signal processing circuit 5 has a configuration such that a feedback circuit 1F is coupled between one node of the output nodes of the demodulation chopper circuit SB for outputting the chopper output signal Vsub(t) and the other node of the input nodes of the modulation chopper circuit SA to which the differential input signal Vsm(t) is applied.

Figure 21:
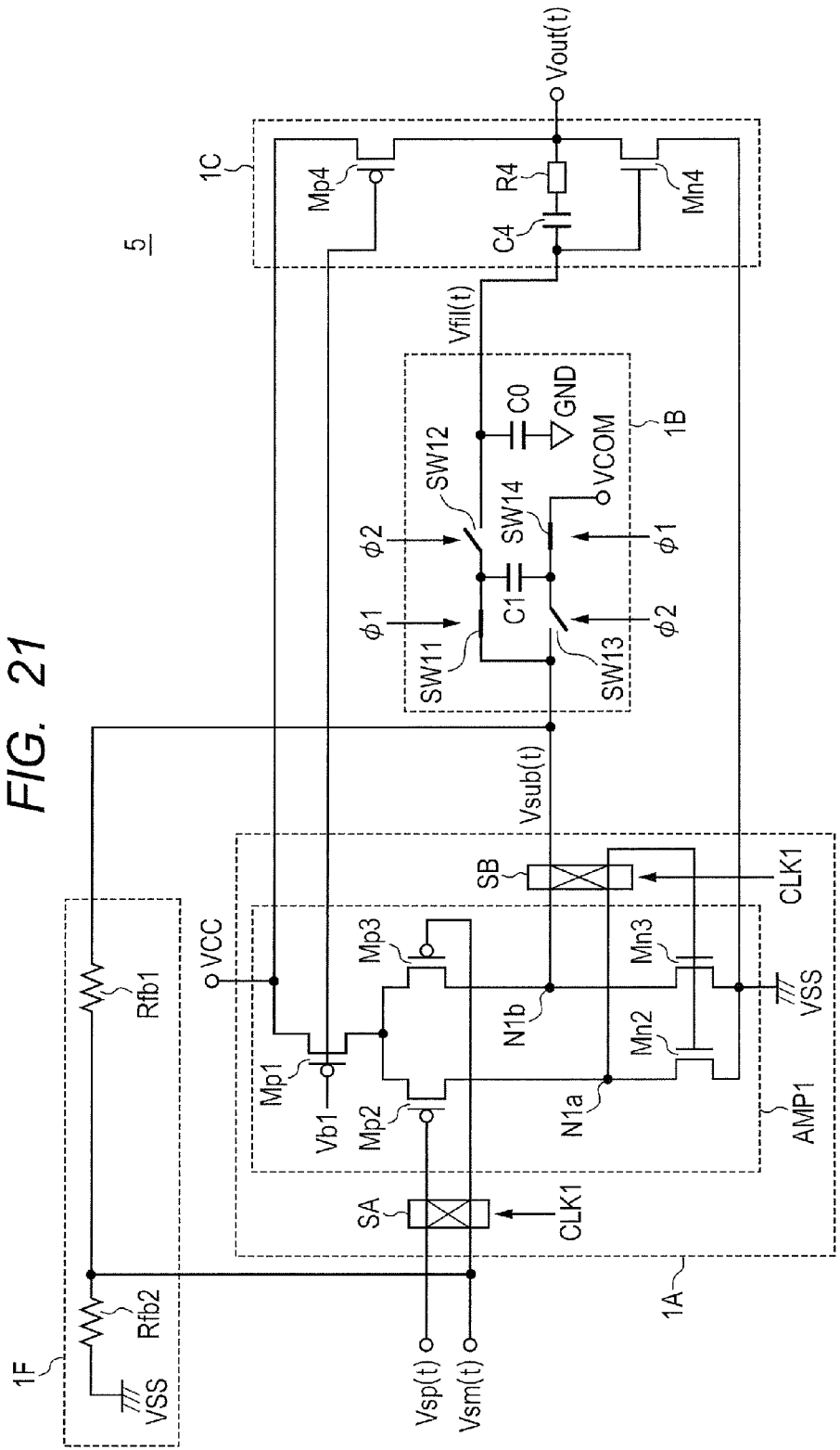
FIG. 21 is a circuit diagram of the signal processing circuit according to the fifth embodiment.

FIG. 21 shows a circuit diagram of the signal processing circuit 5 according to the fifth embodiment. In FIG. 21, what is given the same symbol as that of FIG. 6 has the same configuration as that of FIG. 6, an explanation of each of these configurations is omitted.

The feedback circuit 1F is comprised of a resistor Rfb1 and a resistor Rfb2 that are coupled in series between the one node of the output nodes of the demodulation chopper circuit and wiring to which the power source voltage VSS is applied. One end of the resistor Rfb1 is coupled with one node of output nodes of the demodulation chopper circuit. The other end of the resistor Rfb1 is coupled with one end of the resistor Rfb2. The power source voltage VSS is applied to the other end of the resistor Rfb2. A voltage obtained by dividing a voltage of the chopper output signal Vsub(t) with the resistor Rfb1 and the resistor Rfb2 is applied to the other node of the input nodes of the modulation chopper circuit SA.

FIG. 21 has a configuration such that the feedback circuit 1F is added to the signal processing circuit 1 according to the first embodiment shown in FIG. 6. The feedback circuit 1F is also applicable to any of the signal processing circuit 2 according to the second embodiment shown in FIG. 10, the signal processing circuit 3 according to the third embodiment shown in FIG. 14, and the signal processing circuit 4 according to the fourth embodiment shown in FIG. 17. Specifically, in the signal processing circuit 2 and the signal processing circuit 3, the feedback circuit 1F is coupled so that the chopper output signal Vsub(t) outputted by the chopper amplifier may be fed back to the input node of the modulation chopper circuit SA.

An effect of the signal processing circuit 5 is as follows. That is, providing the feedback circuit 1F makes it possible to adjust a gain of the signal processing circuit 5. Furthermore, it also makes it possible to configure arithmetic circuits, such as an adder and a subtracter.

Sixth Embodiment

Figure 22:
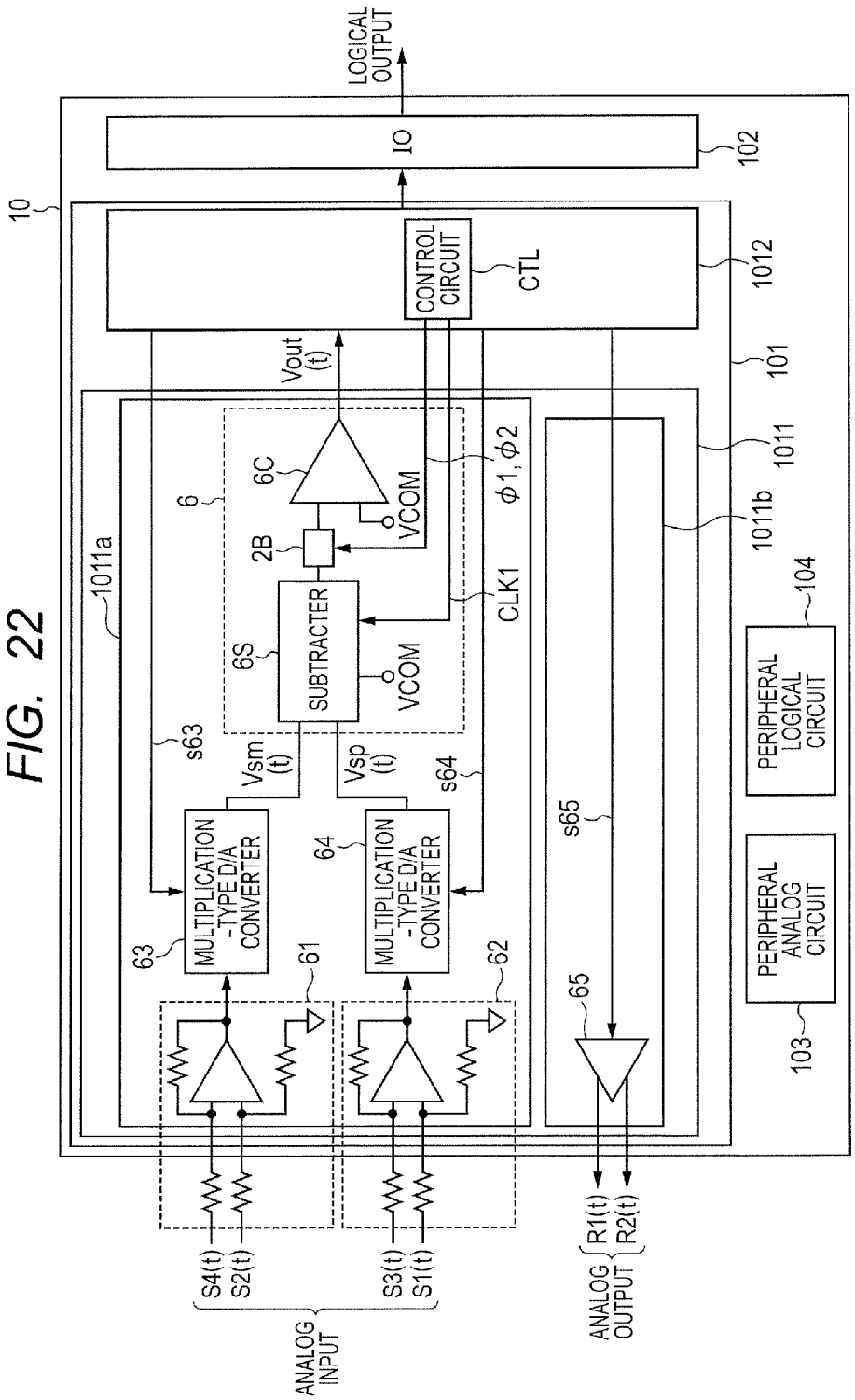
FIG. 22 is a block diagram of a semiconductor device having an R/D converter according to a sixth embodiment.

FIG. 22 is a block diagram of a semiconductor device 10 including an R/D converter 101 according to a sixth embodiment.

The semiconductor device 10 includes the R/D converter 101, an input/output part 102, a peripheral analog circuit 103, and a peripheral logic circuit 104. Incidentally, the R/D converter is an abbreviated notation of the resolver/digital converter.

The R/D converter 101 has an analog circuit part 1011 and a digital signal processing part 1012. The analog circuit part 1011 has an analog input part 1011a and an excitation buffer part 1011b.

The analog input part 1011a has input amplifiers 61 and 62, multiplication-type D/A converters 63 and 64, and a signal processing circuit 6. Resolver signals S1(t) to S4(t) that are analog signals are inputted into the analog input part 1011a. The resolver signals S1(t) and S3(t) are sine wave outputs of the resolver, and are put in an arithmetic operation by the input amplifier 62 and the multiplication-type D/A converter 64 to be converted into the differential input signal Vsp(t). The resolver signals S2(t) and S4(t) are cosine wave outputs of the resolver, and are put in an arithmetic operation by the input amplifier 61 and the multiplication-type D/A converter 63 to be converted into the differential input signal Vsm(t).

The signal processing circuit 6 converts the differential input signal Vsp(t) and the differential input signal Vsm(t) into an error determination signal Vout(t) between an angle signal of the resolver and a digital angle signal, and outputs it to the digital signal processing part 1012.

According to the high level or the low level of the error determination signal Vout(t), the digital signal processing part 1012 feeds back a digital signal s63 and a digital signal s64 to the multiplication-type D/A converters 63 and 64, respectively, so that values of the differential input signal Vsp(t) and the differential input signal Vsm(t) may become almost equal. The digital signal s63 and the digital signal s64 are uniquely decided by angle information of the resolver signals S1(t) to S4(t). As a result, the resolver signals S1(t) to S4(t) are converted into the digital angle signals according to the error determination signal Vout(t).

The digital signal processing part 1012 has the control circuit CTL. The control circuit CTL outputs the chopping clock CLK1, the control clock Φ1, and the control clock Φ2 to the signal processing circuit 6.

Figure 23:
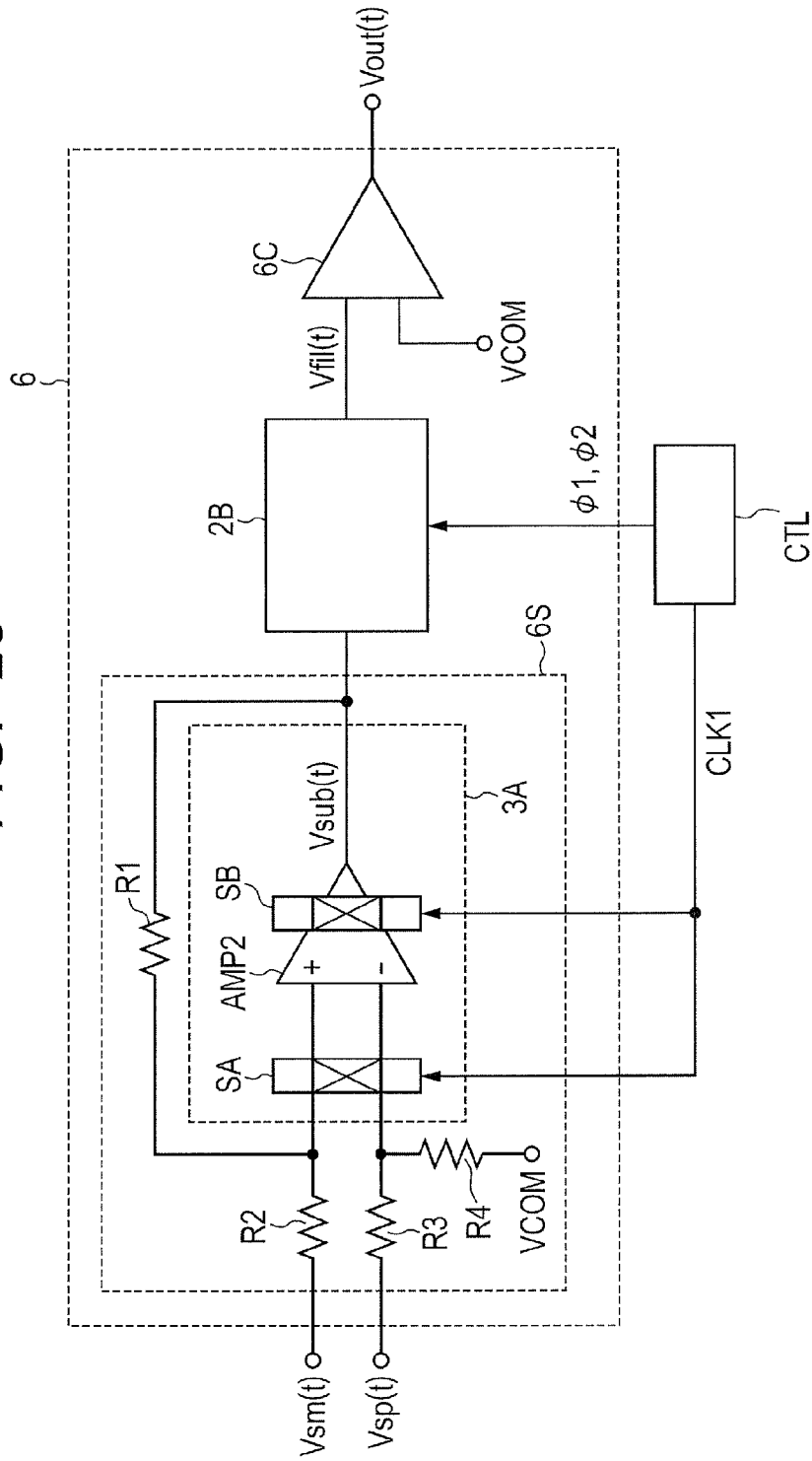
FIG. 23 is a block diagram of a signal processing circuit included in the R/D converter according to the sixth embodiment.

FIG. 23 shows a block diagram of the signal processing circuit 6 included in the R/D converter 101 according to the sixth embodiment.

The signal processing circuit 6 has the subtracter 6S, the adder circuit 2B, and the comparator 6C. The subtracter 6S is comprised of the chopper amplifier 3A and resistors R1 to R4. A configuration of the chopper amplifier 3A is the same configuration as that of the chopper amplifier 3A shown in FIG. 15. The configuration of the adder circuit 2B is the same configuration as that of the adder circuit 2B shown in FIG. 11.

One end of the resistor R2 and one end of the resistor R3 are coupled to one node and the other node of the input nodes of the modulation chopper circuit SA included in the chopper amplifier 3A, respectively. The differential input signal Vsm (t) and the differential input signal Vsp(t) are inputted into the other end of the resistor R2 and the other end of the resistor R3, respectively. The chopper output signal Vsub(t) of the first-stage amplifier AMP2 is fed back to one node of the input nodes of the modulation chopper circuit SA through the resistor R1. One end of the resistor R4 is coupled to the other node of the input nodes of the modulation chopper circuit SA, and the reference signal VCOM is applied to the other end of the resistor R4.

The subtracter 6S outputs a signal corresponding to a difference between the differential input signal Vsm(t) applied to the other end of the resistor R2 and the differential input signal Vsp(t) applied to the other end of the resistor R3 as the chopper output signal Vsub(t). The adder circuit 2B generates the addition signal Vfil(t) obtained by addition of the chopper output signal Vsub(t) on which the non-inversion offset voltage and the inversion offset voltage are superimposed for every half period of the chopping clock CLK1.

The comparator 6C outputs the error determination signal Vout(t) between the angle signal of the resolver and the digital angle signal based on a comparison result of the addition signal Vfil(t) and the reference signal VCOM.

Figure 24:
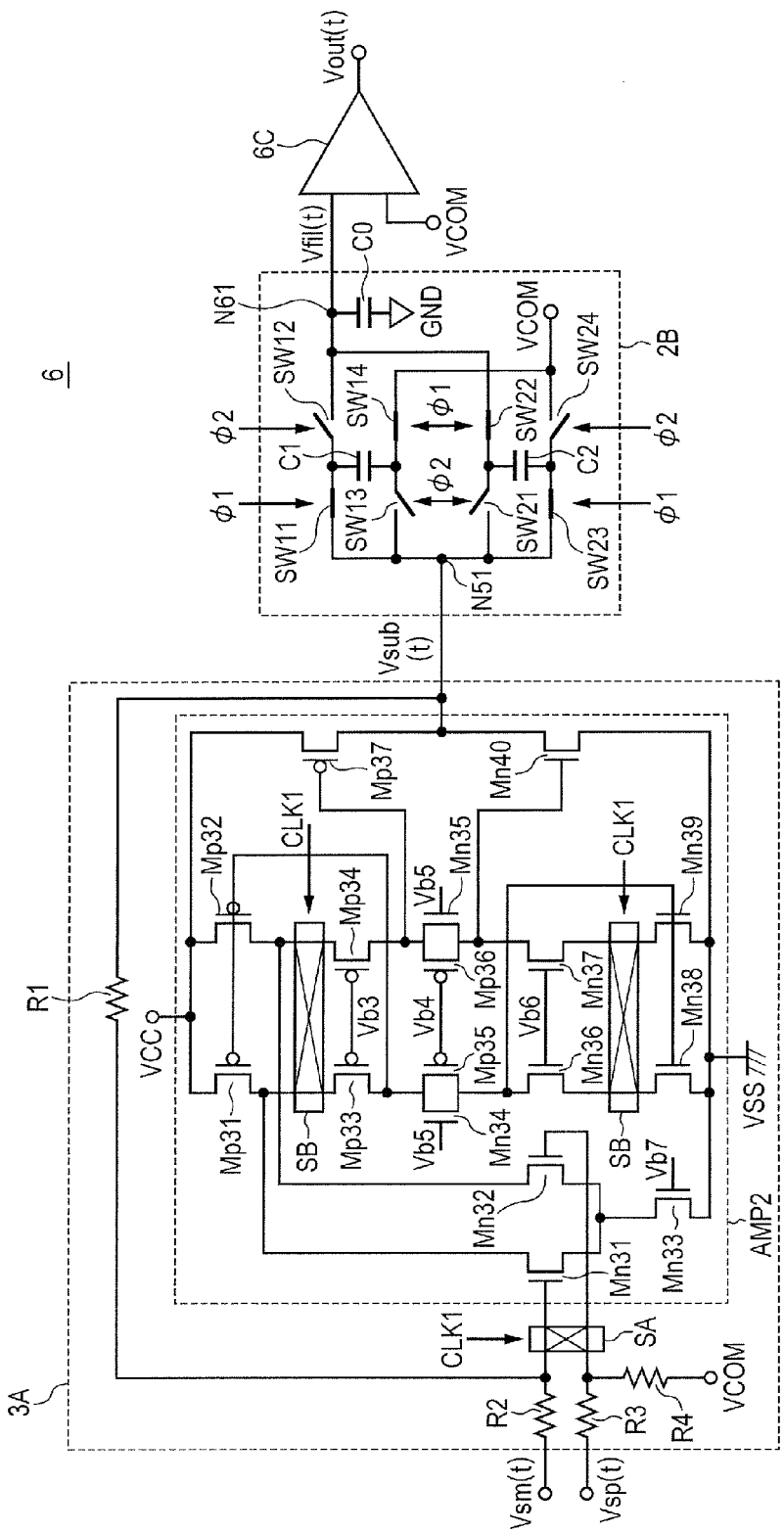
FIG. 24 is a circuit diagram of the signal processing circuit included in the R/D converter according to the sixth embodiment.

FIG. 24 is a circuit diagram of the signal processing circuit 6 included in the R/D converter 101 according to the sixth embodiment.

The chopper amplifier 3A and the adder circuit 2B are the same as those to which the same symbols are given in FIG. 15 and FIG. 11, respectively, and their duplicated explanations are omitted. In the adder circuit 2B, a value of the reference signal VCOM is set to an identical value as the direct current level of the chopper output signal Vsub(t) decided from the common voltage of the differential input signal Vsp(t) and the differential input signal Vsm(t). Therefore, a reference voltage of the comparator 6C is also set to the reference signal VCOM.

An effect of the R/D converter 101 according to the sixth embodiment is as follows.

In the R/D converter 101, an accuracy of the digital angle signal calculated in the digital signal processing part 1012 depends largely on an accuracy of the arithmetic operation of the signal processing circuit 6 into which the differential input signal of the sine wave output and the cosine wave output of the resolver is inputted, i.e., a determination accuracy of the error determination signal Vout(t) between the angle signal of the resolver and the digital angle signal. The subtracter 6S is comprised of the chopper amplifier 3A and the resistors R1 to R4, and the chopper output signal Vsub(t) of the chopper amplifier 3A is converted into the addition signal Vfil(t) by the adder circuit 2B. As a result, the addition signal Vfil(t) outputs a value from which the influence of the offset voltage arising from the first-stage amplifier AMP2 is removed, which secures a conversion accuracy of the R/D converter 101.

Seventh Embodiment

Figure 25:
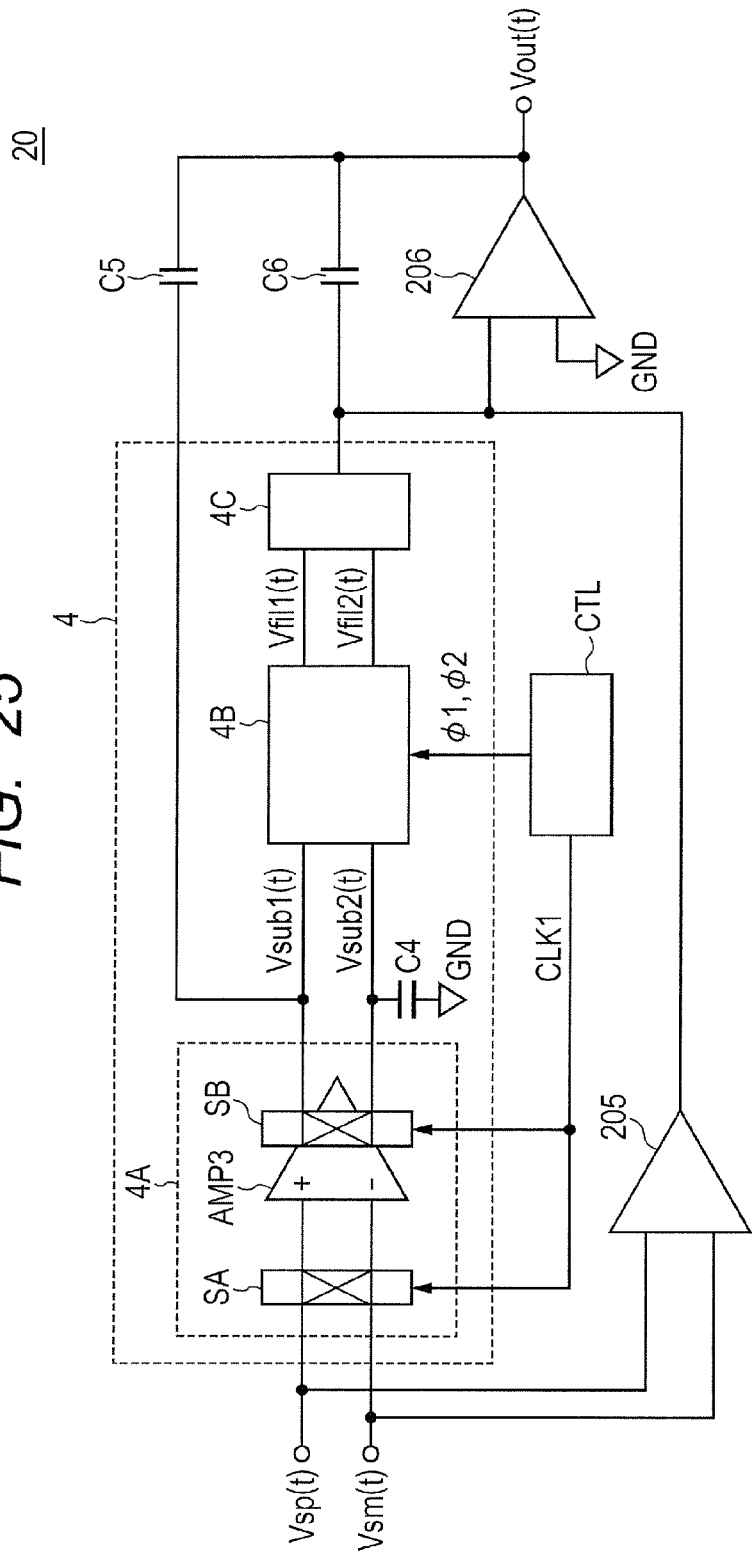
FIG. 25 is a block diagram of a multipath nested mirror amplifier circuit according to a seventh embodiment.

FIG. 25 is a block diagram of a multipath nested mirror amplifier circuit 20 according to a seventh embodiment.

The multipath nested mirror amplifier circuit 20 has the signal processing circuit 4, the control circuit CTL, amplifiers 205, 206, and capacitive elements C5, C6.

The signal processing circuit 4 has the chopper amplifier 4A, the adder 4B, the output-stage amplifier 4C, and the capacitive element C4. The signal processing circuit 4 has a configuration such that one end of the capacitive element C4 for phase compensation is coupled to the other end of the demodulation chopper circuit SB for outputting the chopper output signal Vsub2(t) in the signal processing circuit 4 shown in FIG. 18. The ground voltage GND is applied to the other end of the capacitive element C4. Configurations of the chopper amplifier 4A, the adder circuit 4B, and the output-stage amplifier 4C are the same as those of what are given the same symbols in FIG. 18, respectively.

The differential input signal Vsp(t) and the differential input signal Vsm(t) are inputted into an amplifier 205. A signal such that an output signal of the output-stage amplifier 4C of the signal processing circuit 4, an output signal of the amplifier 205, and an output signal of an amplifier 206 that is fed back by the capacitive element C6 are added is inputted into the amplifier 206. The output signal of the amplifier 206 is superimposed on the chopper output signal Vsub1(t) that the chopper amplifier 4A outputs through the capacitive element C5 and it is inputted into the adder circuit 4B.

The adder circuit 1B_1 (refer to FIG. 18) included in the adder circuit 4B generates the addition signal Vfil1($t$) by addition of the chopper output signal Vsub1($t$) on which the non-inversion offset voltage and the output signal of the amplifier 206 are superimposed and the chopper output signal Vsub1($t$) on which the inversion offset voltage and the output signal of the amplifier 206 are superimposed for every period of the chopping clock CLK1. The adder circuit 1B_2 included in the adder circuit 4B generates the addition signal Vfil2($t$) obtained by addition of the chopper output signal Vsub2($t$) on which the non-inversion offset voltage and the inversion offset voltage are superimposed for every period of the chopping clock CLK1.

The output-stage amplifier 4C outputs an output signal obtained by amplifying a difference of the addition signal Vfil1($t$) and the addition signal Vfil2($t$) to the amplifier 206.

As described above, the multipath nested mirror amplifier circuit 20 has a three stage high gain signal path that is comprised of the chopper amplifier 4A (the first-stage amplifier), the adder circuit 4B and the output-stage amplifier 4C (the second-stage amplifier), and the amplifier 206 (the third-stage amplifier). The multipath nested mirror amplifier circuit 20 has further a two-stage broadband signal path comprised of the amplifier 205 and the amplifier 206.

Feeding back the output signal of the amplifier 206 to an input side of the adder circuit 4B through the capacitive element C5 realizes that an output of the third-stage amplifier of the first path is fed back to an input of the second-stage amplifier. Furthermore, by placing the signal processing circuit 4 in the first stage of the first path, the influence of the offset voltage on an output signal of the multipath nested mirror amplifier circuit 20 is reduced.

In the explanations of the signal processing circuits according to respective embodiments, association between the logic level of the chopping clock CLK1 and the ON/OFF states of each switch in the modulation chopper circuit SA and the demodulation chopper circuit SB shows one example. The relationship of the both can be altered appropriately.

Moreover, it is not necessarily required to set the ON/OFF states of each switch in the modulation chopper circuit SA and the demodulation chopper circuit SB to identical states. That is, in the modulation chopper circuit SA and in the demodulation chopper circuit SB, when outputting the input signal applied to each input node from its output node, an interchanging operation of the input signal is set up independently in the modulation chopper circuit SA and in the demodulation chopper circuit SB, respectively.

For example, an operation of the demodulation chopper circuit SB is set up so that when the differential input signals Vsp(t) and Vsm(t) are periodically interchanged and are applied to the first-stage amplifier AMP1 in the chopper amplifier 1A shown in FIG. 1, the chopper amplifier 1A may output alternately the chopper output signal Vsub(t) on which the non-inversion offset voltage and the inversion offset voltage are superimposed. An operation setting of the demodulation chopper circuit SB to an operation of this modulation chopper circuit SA is decided in consideration of a circuit configuration of the first-stage amplifier AMP1, etc.

The first-stage amplifier AMP1 etc. in the signal processing circuit is not limited to the specific circuit configuration disclosed in each embodiment, and what is necessary is just to be an amplifier for amplifying the differential input signals.

It should be thought that the embodiments disclosed this time are illustrations in all respects and are not restrictive. The scope of the present invention is defined by the scope of the appended claims rather than by the above-mentioned description, and it is intended to include all changes that fall within the meaning equivalent to the scope of the claims.

What is claimed is:

1. A signal processing circuit, comprising:
    a chopper amplifier that generates a chopper output signal by amplifying differential input signals; and
    an adder circuit that generates an addition signal by addition of the chopper output signal,
    wherein the chopper amplifier includes a differential amplifier circuit that amplifies the differential input signals, and the differential input signals inputted into the differential amplifier circuit are interchanged for every first phase period and second phase period of a control clock,
    wherein the chopper amplifier generates the chopper output signal on which a non-inversion offset voltage and an inversion offset voltage are superimposed, respectively, in the first phase period and in the second phase period, and
    wherein the adder circuit generates the addition signal by addition of the chopper output signal in the first phase period and in the second phase period.

2. The signal processing circuit according to claim 1, wherein the chopper amplifier includes:
    a modulation chopper circuit that has a first input node pair and a first output node pair;
    the differential amplifier circuit that has a second input node pair and a second output node pair; and
    a demodulation chopper circuit that has a third input node pair and a third output node pair,
    wherein in response to the control clock, the modulation chopper circuit interchanges the differential input signals applied to the first input node pair for the every first phase period and second phase period, and outputs modulation differential input signals from the first output node pair,
    wherein the differential amplifier circuit outputs modulation differential output signals from the second output node pair by amplifying the modulation differential input signals applied to the second input node pair, and
    wherein in response to the control clock, the demodulation chopper circuit interchanges the modulation differential output signals applied to the third input node pair for the every first phase period and second phase period, and outputs the chopper output signal from the third output node pair.

3. The signal processing circuit according to claim 2, wherein the adder circuit includes a first switching circuit and a first arithmetic capacitive element,
    wherein the first switching circuit applies the chopper output signal and a reference voltage to one end and the other end of the first arithmetic capacitive element, respectively, over a first sampling period in the first phase period, and
    applies the chopper output signal to the other end of the first arithmetic capacitive element over a second sampling period in the second phase period, and
    wherein the adder circuit outputs the addition signal from the one end of the first arithmetic capacitive element over the second sampling period.

4. The signal processing circuit according to claim 2, further comprising:
    a feedback circuit that applies the chopper output signal to either one of nodes of the first input node pair.

5. The signal processing circuit according to claim 3, wherein the adder circuit further includes a second switching circuit and a second arithmetic capacitive element, wherein the second switching circuit applies the chopper output signal to the other end of the second arithmetic capacitive element over the first sampling period, and applies the chopper output signal and the reference voltage to one end and the other end of the second arithmetic capacitive element, respectively, over the second sampling period, and wherein the adder circuit outputs the addition signal from the other end of the second arithmetic capacitive element over the first sampling period.

6. The signal processing circuit according to claim 2,
wherein the control clock whose logic level changes with a predetermined period is supplied to the modulation chopper circuit, the demodulation chopper circuit, and the adder circuit, and wherein the first phase period and the second phase period correspond to a period in which the control clock maintains one logic level and to a period in which the control clock maintains the other logic level, respectively.

7. The signal processing circuit according to claim 5,
wherein the first sampling period is decided based on a width of a first sampling pulse that is generated after a predetermined delay time lapses from a start time of the first phase period, and the second sampling period is decided based on a width of a second sampling pulse that is generated after the delay time lapses from a start time of the second phase period.

8. The signal processing circuit according to claim 7,
wherein the first sampling pulse is generated just before end of the first phase period, and the second sampling pulse is generated just before end of the second phase period.

9. The signal processing circuit according to claim 5, further comprising:
a feedback circuit that applies the chopper output signal to either one of nodes of the first input node pair.

10. The signal processing circuit according to claim 1,
wherein the chopper amplifier includes:
a modulation chopper circuit that has a first input node pair and a first output node pair;
the differential amplifier circuit that has a second input node pair and a second output node pair; and
an amplifier circuit that amplifies an output signal of the differential amplifier circuit, wherein in response to the control clock, the modulation chopper circuit interchanges the differential input signals applied to the first input node pair for the every first phase period and second phase period, and outputs modulation differential input signals from the first output node pair, wherein the differential amplifier circuit outputs differential output signals from the second output node pair by amplifying and demodulating the modulation differential input signals applied to the second input node pair, and wherein the amplifier circuit outputs the chopper output signal by amplifying the differential output signals.

11. The signal processing circuit according to claim 10,
wherein the adder circuit includes a first switching circuit and a first arithmetic capacitive element,
wherein the first switching circuit applies the chopper output signal and a reference voltage to one end and the other end of the first arithmetic capacitive element over a first sampling period in the first phase period and applies the chopper output signal to the other end of the first arithmetic capacitive element over a second sampling period in the second phase period, and wherein the adder circuit outputs the addition signal from one end of the first arithmetic capacitive element over the second sampling period.

12. The signal processing circuit according to claim 10, further comprising:
a feedback circuit that applies the chopper output signal to either one of nodes of the first input node pair.

13. The signal processing circuit according to claim 1,
wherein the chopper amplifier includes:
a modulation chopper circuit that has a first input node pair and a first output node pair;
the differential amplifier circuit that has a second input node pair and a second output node pair; and
a demodulation chopper circuit that has a third input node pair and a third output node pair, wherein in response to the control clock, the modulation chopper circuit interchanges the differential input signals applied to the first input node pair for every first phase period and second phase period, and outputs modulation differential input signals from the first output node pair, wherein the differential amplifier circuit outputs a first modulation output signal and a second modulation output signal from one node and the other node of the second output node pair, respectively, by amplifying the modulation differential input signals applied to the second input node pair, wherein in response to the control clock, the demodulation chopper circuit interchanges the first modulation output signal and the second modulation output signal for every first phase period and second phase period, and outputs a first chopper output signal and a second chopper output signal that are the chopper output signal from one node and the other node of the third output node pair, respectively, and wherein the adder circuit generates a first addition signal and a second addition signal that are the addition signal, respectively, by addition of the first chopper output signal and the second chopper output signal in the first phase period and in the second phase period.

14. The signal processing circuit according to claim 13,
wherein the adder circuit includes a first adder circuit and a second adder circuit,
wherein the first adder circuit has a first switching circuit and a first arithmetic capacitive element,
wherein the second adder circuit has a second switching circuit and a second arithmetic capacitive element,
wherein the first switching circuit applies the first chopper output signal and a reference voltage to one end and the other end of the first arithmetic capacitive element, respectively, over a first sampling period in the first phase period, and applies the first chopper output signal to the other end of the first arithmetic capacitive element over a second sampling period in the second phase period, wherein the second switching circuit applies the second chopper output signal and the reference voltage to one end and the other end of the second arithmetic capacitive element, respectively, over the first sampling period in the first phase period, and applies the second chopper output signal to the other end of the second arithmetic capacitive element over the second sampling period in the second phase period, and wherein the adder circuit outputs the first addition signal and the second addition signal from one end of the first arithmetic capacitive element and from one end of the second arithmetic capacitive element, respectively, over the second sampling period.

15. A resolver digital converter, comprising:

a signal processing circuit that converts differential input signals generated based on a sine wave output and a cosine wave output of a resolver into an error determination signal between an angle signal of the resolver and a digital angle signal and outputs the error determination signal, wherein the signal processing circuit includes:

a chopper amplifier for generating a chopper output signal by amplifying the differential input signals;

an adder circuit for generating an addition signal by addition of the chopper output signal; and a comparator for generating the error determination signal using the addition signal, wherein the chopper amplifier has a differential amplifier circuit for amplifying the differential input signals, and the differential input signals inputted into the differential amplifier circuit are interchanged for every first phase period and second phase period of a control clock, wherein the chopper amplifier generates the chopper output signal on which a non-inversion offset voltage and an inversion offset voltage are superimposed in the first phase period and in the second phase period, respectively, based on an output of the differential amplifier circuit, and wherein the adder circuit generates the addition signal by addition of the chopper output signal in the first phase period and in the second phase period.

16. The resolver digital converter according to claim 15, wherein the chopper amplifier includes:

a modulation chopper circuit that has a first input node pair and a first output node pair; and the differential amplifier circuit that has a second input node pair, wherein in response to the control clock, the modulation chopper circuit interchanges the differential input signals applied to the first input node pair for every first phase period and second phase period and outputs modulation differential input signals from the first output node pair, and wherein the differential amplifier circuit outputs the chopper output signal by demodulating and amplifying the modulation differential input signals applied to the second input node pair.

17. A multipath nested mirror amplifier, comprising:

a signal processing circuit to which differential input signals are applied and that outputs a first output signal;

a second amplifier to which the differential input signals are applied and that outputs a second output signal;

a third amplifier to which the second output signal is applied and that outputs a third output signal;

a first capacitive element; and a second capacitive element, wherein the signal processing circuit includes:

a chopper amplifier that generates a chopper output signal by amplifying the differential input signals;

an adder circuit that generates an addition signal by addition of the chopper output signal; and a first amplifier that outputs the first output signal by amplifying the addition signal, wherein the chopper amplifier includes a differential amplifier circuit that amplifies the differential input signals, the differential input signals inputted into the differential amplifier circuit being interchanged for every first phase period and second phase period of a control clock, wherein the chopper amplifier generates the chopper output signal on which a non-inversion offset voltage and an inversion offset voltage are superimposed in the first phase period and in the second phase period, respectively, based on an output of the differential amplifier circuit, wherein the adder circuit generates the addition signal by addition of the chopper output signal in the first phase period and in the second phase period, wherein the first amplifier outputs the first output signal by amplifying the addition signal, wherein the second amplifier outputs the second output signal by amplifying the differential input signals, wherein the third amplifier outputs a third output signal by amplifying a signal such that the first output signal, the second output signal, and the third output signal fed back through the first capacitive element are added, and wherein the third amplifier feeds back the third output signal to an input terminal of the adder circuit through the second capacitive element.

18. The multipath nested mirror amplifier according to claim 17, wherein the chopper amplifier further includes a modulation chopper circuit that has a first input node pair and a first output node pair, wherein in response to the control clock, the modulation chopper circuit interchanges the differential input signals applied to the first input node pair for every first phase period and second phase period, and outputs modulation differential input signals from the first output node pair, and wherein in the differential amplifier circuit, the chopper amplifier outputs the chopper output signal.

* * * * *